United States Patent [19]

Inoue

[11] Patent Number: 5,757,048
[45] Date of Patent: May 26, 1998

[54] THIN FILM TRANSISTOR, SOLID STATE DEVICE, DISPLAY DEVICE AND MANUFACTURING METHOD OF A THIN FILM TRANSISTOR

[75] Inventor: Satoshi Inoue, Suwa, Japan

[73] Assignee: Seiko Epson Corporation, Tokyo, Japan

[21] Appl. No.: 881,097

[22] Filed: Jun. 24, 1997

Related U.S. Application Data

[60] Continuation of Ser. No. 583,349, Jan. 5, 1996, abandoned, which is a division of Ser. No. 199,185, filed as PCT/JP93/00849, Jun. 23, 1993, Pat. No. 5,508,216.

[30] Foreign Application Priority Data

| Jun. 24, 1992 | [JP] | Japan | 4-166021 |
| Nov. 25, 1992 | [JP] | Japan | 4-315331 |
| Dec. 4, 1992 | [JP] | Japan | 4-325315 |

[51] Int. Cl.$^6$ .................. H01L 27/01; H01L 29/76
[52] U.S. Cl. .................. 257/344; 257/351; 257/408; 257/59
[58] Field of Search .................. 257/344, 347, 257/351, 66, 408, 59

[56] References Cited

U.S. PATENT DOCUMENTS

| 5,266,504 | 11/1993 | Blouse et al. | 257/344 |
| 5,308,998 | 5/1994 | Yamazaki et al. | 257/344 |
| 5,323,042 | 6/1994 | Matsumoto | 257/344 |
| 5,554,861 | 9/1996 | Mano et al. | 257/71 |

FOREIGN PATENT DOCUMENTS

| A-0 544 229 | 6/1993 | European Pat. Off. | |
| 58-142566 | 8/1983 | Japan | 257/344 |
| 58-206121 | 12/1983 | Japan | 257/344 |
| 60-47467 | 3/1985 | Japan | 257/344 |
| 61-104371 | 5/1986 | Japan | 257/344 |
| 61-85868 | 5/1986 | Japan | 257/344 |
| 61-170724 | 8/1986 | Japan | 257/344 |
| 2-246277 | 10/1990 | Japan | 257/344 |
| 2-280371 | 11/1990 | Japan | 257/344 |
| 3-79081 | 4/1991 | Japan | 257/344 |
| 4-115230 | 4/1992 | Japan | 257/244 |
| 4-139764 | 5/1992 | Japan | 257/347 |

OTHER PUBLICATIONS

IEEE Electron Device Letters, vol. 9, No. 1, 1 Jan. 1988 New York US pp. 23–25, K. Tanaka 'Characteristics of Offset–Structure polycrystalline silicon thin film transistors' *p. 23, right col.; figure 1*.

Proceedings of the International Display Research Conference, San Diego, Oct. 15–17, 1991, No. CONF. 11, Oct. 1991 Institute of Electrical and Electronics Engineers, pp. 219–222, XP 000314357 Little T W et al 'A 9.5 Inch Mega–Pixel Lpw Temperatur Poly–Si TFT–LCD Fabricated by SPC of Very Thin Films and an ECT–CVD Gate Insulator' *p. 1*.

*Primary Examiner*—Donald Monin
*Attorney, Agent, or Firm*—Mark P. Watson

[57] ABSTRACT

A thin film transistor which can improve such electric characteristics as off current characteristics, and a manufacturing method of a thin film transistor. A thin film transistor (110) has an n$^-$ source area (112) and an n$^-$ drain area (113) consisting of an n$^-$ silicon film (low concentration area) of about 400 Å, which is a silicon film made by performing a crystallization treatment such as an SPC method on an amorphous silicon, and the crystallization treatment is carried out after the implantation of impurities to activate the impurities at the same time. A gate electrode (116) is a metal electrode, and is formed after an n$^-$ source area (112) and an n$^-$ drain area (113) are formed. A gate electrode (116), an n$^-$ source area (112) and an n$^-$ drain area (113) are not formed self-alignedly.

18 Claims, 16 Drawing Sheets

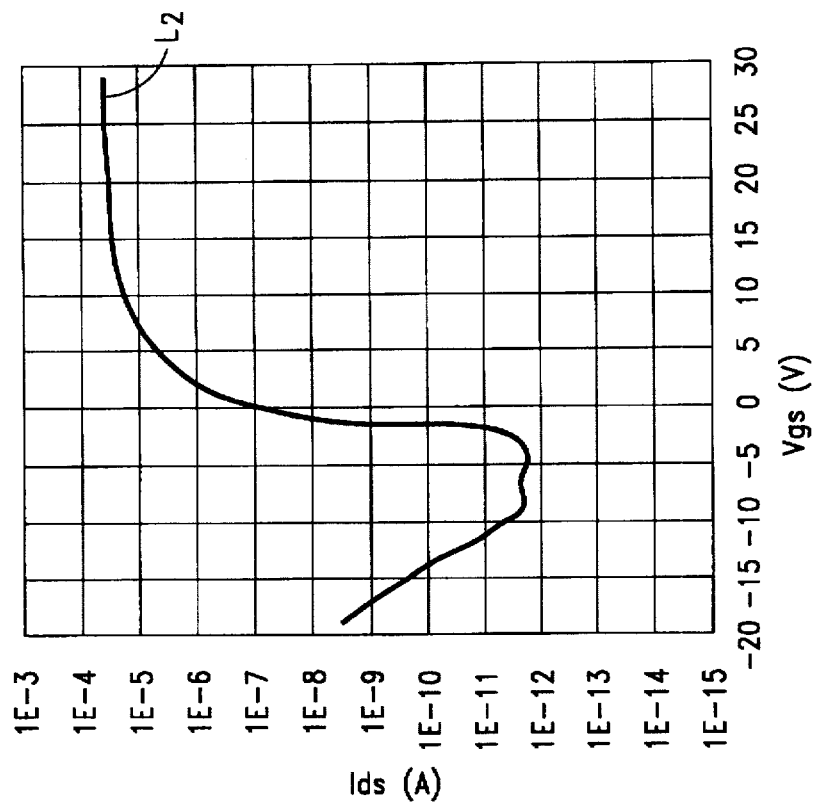
FIG.—2B
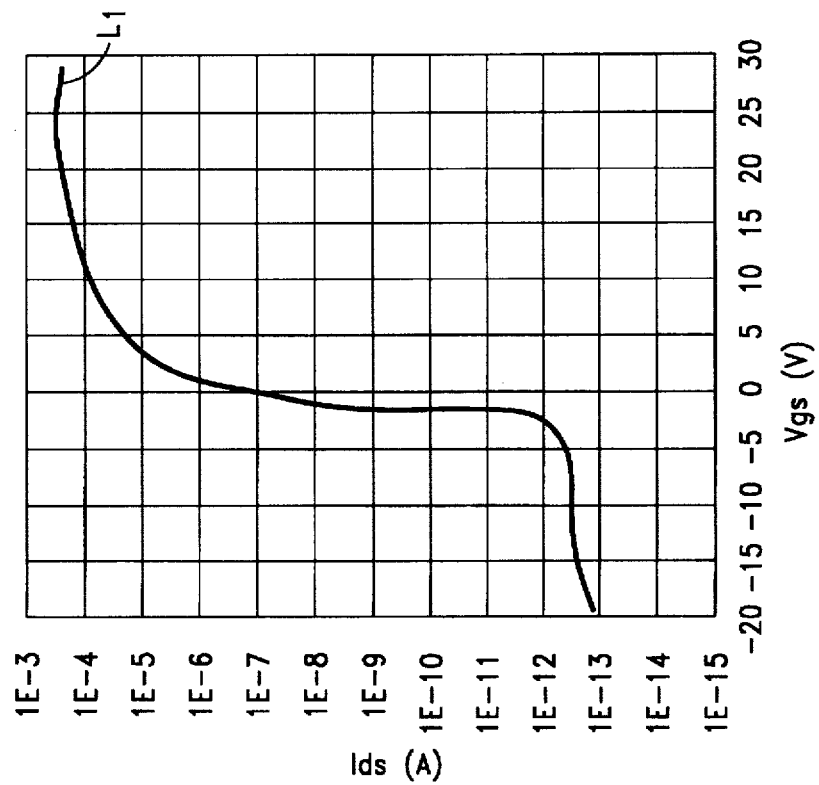
FIG.—2A

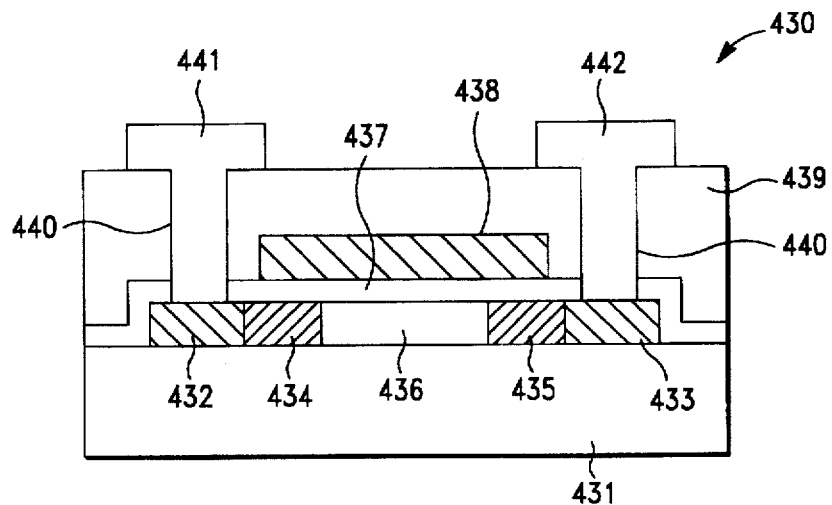
FIG.—7
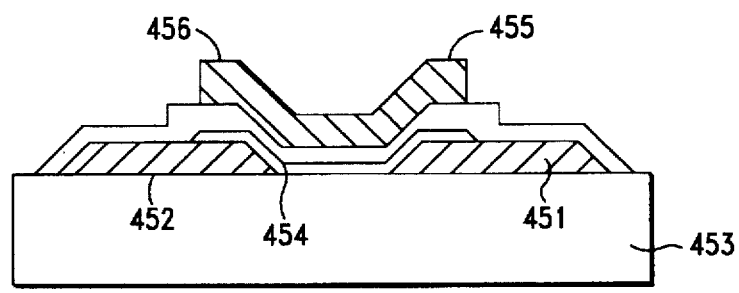
FIG.—8A
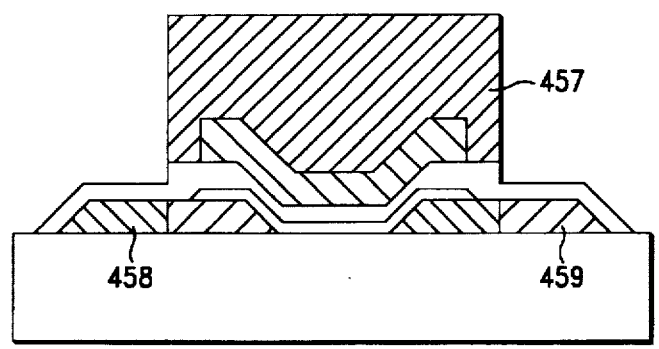
FIG.—8B
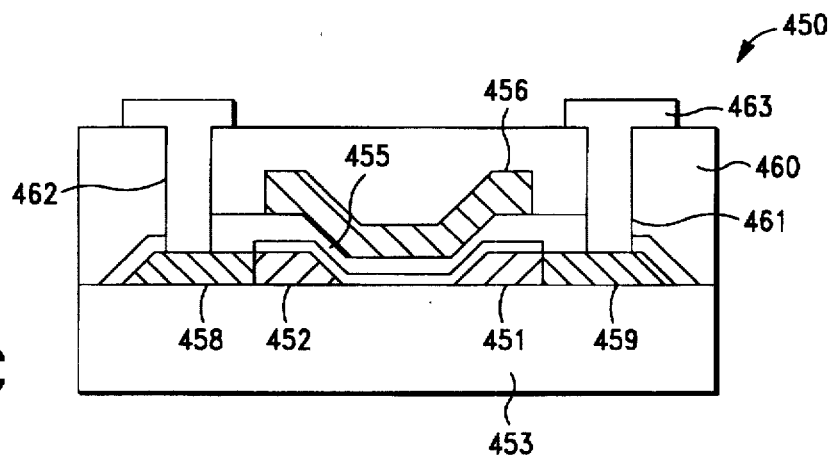
FIG.—8C

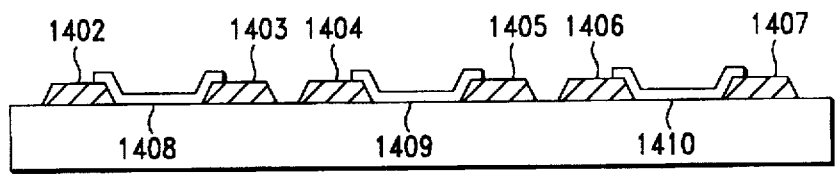
FIG.−19A
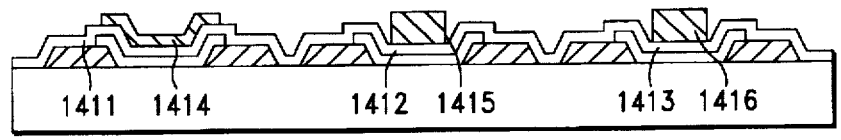
FIG.−19B
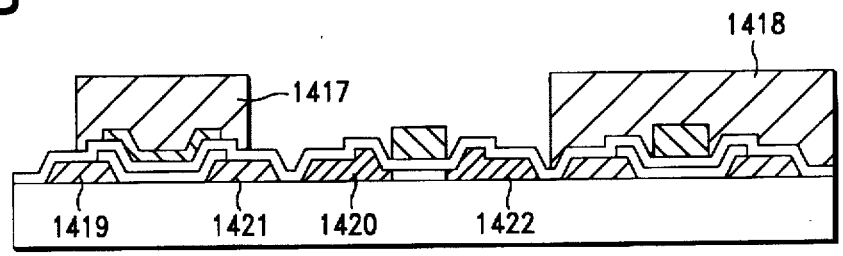
FIG.−19C
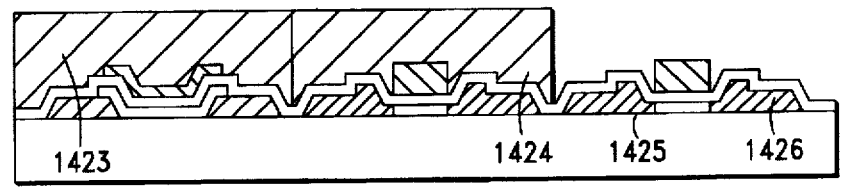
FIG.−19D
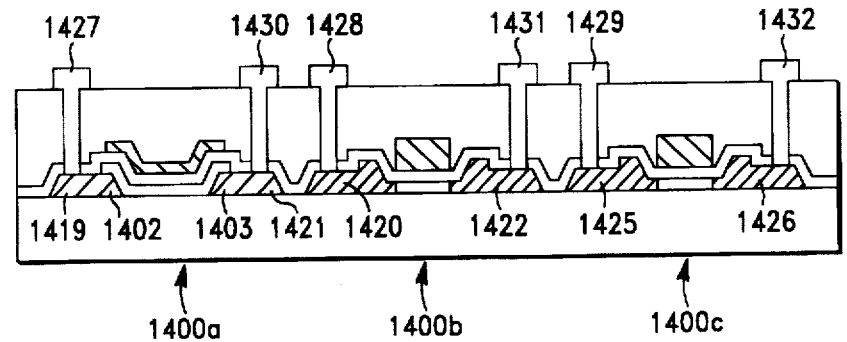
FIG.−19E

THIN FILM TRANSISTOR, SOLID STATE DEVICE, DISPLAY DEVICE AND MANUFACTURING METHOD OF A THIN FILM TRANSISTOR

This is a continuation of application Ser. No. 08/583,349, filed Jan. 5, 1996 now abandoned which is a divisional of application Ser. No. 08/199,185, filed as PCT/JP93/00849, Jun. 23, 1993, now U.S. Pat. No. 5,508,216.

TECHNICAL FIELD

The present invention relates to a thin film transistor, a solid device such as a semiconductor device, a display device such as a liquid crystal display panel, and a manufacturing method of a thin film transistor. More particularly, the present invention pertains to an improved technique of electrical characteristics of a thin film transistor.

BACKGROUND ART

In an active matrix substrate a liquid crystal display panel and so on, a thin film transistor on board as its switching element is, as is shown in FIG. 20, for instance, formed in such a way that a source area 2205 and a drain area 2206 are self-aligned, by after forming a gate oxidation film 2203 on the face of a silicon layer 2202 on the surface of a substrate 2201, implanting ions to it, with a gate electrode 2204 on the surface of 2203 as a mask, to make a part of the silicon layer electrically-conductive. A thin film transistor having a structure shown in FIG. 20, however, as is shown by a solid line L3 in FIG. 21, has a problem that an intense drain current flows even when a negative gate voltage is applied (off state) to a gate electrode 2204. This could be understood as a phenomenon in which at the end of a drain area 2206 which is biased in the opposite direction, a pn-junction breaks and a hole is implanted. The intensity of a drain current tends to be determined by the voltage applied to between a gate electrode 2204 and a drain area 2206, and density of a trap energy level in a silicon layer corresponding to a drain area 2206 and an end of a gate electrode 2204 near a drain area 2206. Accordingly, a structure may be adopted where a ratio of on-off current is increased by employing a drain structure whose field strength is weakened (LDD structure) by establishing a low concentration area at an end of a drain area corresponding to an end of a gate electrode. In order to manufacture a thin film transistor with this LDD structure, a following manufacturing method has been adopted conventionally. First, as is shown in FIG. 22(a), after forming a pattern 2402 consisting of a silicon film on the face of a substrate 2401, its face is covered with a gate insulation film 2403, on the surface of which an electrically-conductive film 2404, which is to constitute a gate electrode, is formed.

Second, as is shown in FIG. 22(b), a regist pattern 2405 is formed on the face of an electrically-conductive film 2404 by employing a photolithography technique. By performing an etching selectively, with the resist pattern 2405 used as a mask, a gate electrode 2406, thinner than a resist pattern, is formed.

Third, in an ion implantation method, by implanting impurities which are to be a donor or an acceptor, as much as $1 \times 10^{15} \mathrm{cm}^{-2}$ for instance, a source area 2407 and a drain area 2408 are formed in a self-aligned way, as in FIG. 22(c). An area where ions were not injected on account of a gate electrode 2406 and a resist pattern 2405 becomes a channel area 2409.

Fourth, a regist pattern 2405 is removed. In order to form an LDD structure, as is shown in FIG. 22(d), by implanting impurities about $1 \times 10^{14} \mathrm{cm}^{-2}$ in an ion implantation method, with a gate electrode 2406 as a mask, low concentration areas 2410 and 2411 are formed in an area corresponding to an end of a gate electrode 2406.

In a manufacturing method of a thin film transistor with a conventional LDO structure, however, because after a gate electrode 2406 is formed, a source area 2407, a drain area 2408 and low concentration areas 2410 and 2411 are formed, when a silicon film to which impurities are implanted is heat-treated at about 1000° C. to activate the impurities, a gate electrode 2406 is also heated. Therefore, there arises a problem that only materials having high heat resistance such as a silicon compound can be used as materials of a gate electrode 2406, at the expense of its electric resistance and so on. If signals are transmitted by employing wires formed simultaneously with a gate electrode 2406, as in an active matrix substrate of a liquid crystal display panel, signals are retarded much on account of the high electric resistance. There is an alternative method in which the impurities are activated by irradiating a laser beam partially without giving heat stress to a gate electrode 2406. In this method, density of a trap energy level is increased because the crystalline state which was disturbed by the implantation of impurities cannot be restored sufficiently. Hence an off current increases, and the adoption of an LDD structure becomes meaningless.

Taking the above-mentioned problems into consideration, the object of the present invention lies in realizing a thin film transistor, a solid device such as a semiconductor device, a diplay device such as a liquid crystal display panel, which can improve electrical characteristics such as off-current characteristics by the improvement of the composition of source and drain areas and a gate electrode, and a manufacturing method of a thin film transistor.

DISCLOSURE OF INVENTION

In order to solve the above-mentioned problems, in a thin film transistor according to the present invention, a channel area which can form a channel between a source area and a drain area, and a gate electrode which confronts the channel area through a gate insulation film on the face of the channel area are set up on the face of a substrate. In a source area and a drain area, an area which overlaps an end of a gate electrode through a gate insulation film is a low concentration area formed in a process prior to that of a gate electrode, area whose impurity concentration is under $1 \times 10^{20} \mathrm{~cm}^{-3}$, for instance. That is to say, a source area and a drain area have a structure where the areas are formed in a process prior to that of a gate electrode, and have a low concentration area overlapping a gate electrode, or a source area and a drain area have a structure where the areas as a whole are a low concentration area formed in a process prior to that of a gate electrode and its end overlaps the gate electrode.

In a thin film transistor according to the present invention, a source area and a drain area are not formed by implanting impurities with a gate electrode used as a mask, but are formed before a gate electrode is formed. Accordingly, when the implanted impurities are activated, a gate electrode is not formed yet. Therefore, it is possible to activate impurities without being restricted by the heat resistance of components of a gate electrode. More particularly, when a thin film transistor is formed in a low-temperature process, since a channel area can be crystallized after the implantation of impurities, density of a trap energy level can be reduced in a drain area corresponding to an end of a gate electrode and its neighborhood. Furthermore, as it is a low concentration area of a source area and a drain area that confronts the gate electrode, electric field strength is small at the end of a gate electrode. Hence, the improvement of an off current characteristics of a thin film transistor can be obtained.

When a thin film transistor according to the present invention is formed in a low-temperature process in which the process highest temperature is restrained under about 600° C., it is desirable that an activation process to form a low concentration area serve as a crystallization treatment of a channel area at the same time.

That is, after forming a silicon film to constitute a low concentration area and a channel area, impurities are implanted selectively, and then the crystallization treatment is performed and the impurities are activated at the same time. As a crystallization treatment, the following methods can be adopted: a laser annealing method, in which a silicon film is crystallized by irradiating a laser beam to it and impurities are activated simultaneously; a solid phase crystallization method (SPC method), in which a silicon film is crystallized by annealing it for a long time at a low temperature and impurities are activated at the same time; or a rapid thermal annealing method (RTA method), in which a silicon film is crystallized by lamp annealing it and impurities are activated simultaneously.

In the present invention, it is desirable to reduce a parasitic resistance by setting up a low resistance area which connects to a low concentration area with a high impurity concentration, or a low resistance area which connects to a low concentration area with a thick film respectively in a source area and a drain area. It is also possible to form a channel area, a source area and a whole drain area or a part of it in a different process.

It is desirable for a film in a low concentration area to have an equal thickness to a film in a channel. Or it is desirable to set up the thickness of a film in a low concentration area thin compared to the thickness of a depletion layer which is formed in such a condition that the thickness is determined by the impurity concentration in a low concentration area when potential is applied to a gate electrode. The thickness of a film in a low concentration area is set up, for instance, under about 500 Å.

Such a thin film transistor can be used in various solid devices such as a three-dimensional integrated circuit (semiconductor device) and an image sensor. It is also possible to make a display device such as a liquid crystal display panel, with a thin film transistor according to the present invention used as a pixel transistor (component) in a pixel area of an active matrix array. In this case, for example, it is possible to constitute a thin film transistor according to the present invention of an n-channel type thin film transistor, while in a CMOS circuit of a drive circuit area formed on the same substrate together with an active matrix array, it is possible to use an n-channel type thin film transistor of the same structure as a thin film transistor and a p-channel type thin film transistor formed in a self-aligned way to a gate electrode. As another combination, conversing the structure of an n-channel type thin film transistor and a p-channel type thin film transistor, it is possible for the p-channel type thin film transistor to be of the structure according to the present invention, and for the p-channel type thin film transistor to be self-aligned. In this case, the pixel part is constituted of a p-channel type thin film transistor.

In a pixel part, while a thin film transistor according to the present invention is used, in a drive circuit formed on the same substrate together with an active matrix array, for any thin film transistor constituting a CMOS circuit, an n-channel type thin film transistor and a p-channel type thin film transistor which are formed in a self-aligned way to a gate electrode can be used.

Whichever combination is employed to constitute a thin film transistor in a pixel part and a drive circuit, the impurity concentration of each area should be, for instance, over about $1 \times 10^{20}$ cm$^{-3}$ in a source area and a drain area of a self-aligned thin film transistor, and under about $1 \times 10^{20}$ cm$^{-3}$ in a low concentration area of a non-self-aligned thin film transistor. As to thin film transistors formed on a substrate the thickness of a film of source and drain areas of a self-aligned thin film transistor may sometimes be equal to that of a film-in a low concentration area of a non-self-aligned thin film transistor.

In an active matrix array, storage capacitance is usually connected in series to a drain area of a thin film transistor constituting a pixel area. The storage capacitance can be formed, for example, with a scanning line in prior stage as an upper electrode, a gate insulation film of a thin film transistor as a capacitor insulation film, and an extended area formed by extending a drain area of a thin film transistor as a lower electrode.

However, when a thin film transistor is made employing a conventional technique, that is, when source and drain areas are formed after a gate electrode is formed, after a gate electrode is formed, ions cannot be implanted to the lower part, therefore a process needs to be added to form a lower electrode under a gate line of the prior stage. In a thin film transistor according to the present invention, by contrast, since at least a low concentration area is formed before a gate electrode is formed, an extended area can be made in a drain area to be used as a lower electrode thanks to this process.

BRIEF DESCRIPTION OF THE DRAWINGS

FIG. 2(a) is a graph showing off current characteristics of a thin film transistor shown in FIG. 1; FIG. 2(b) is a graph showing off current characteristics of a thin film transistor according to the comparative embodiment;

FIG. 7 is a sectional view showing a structure of a thin film transistor according to the fourth embodiment of the present invention;

FIGS. 8(a) to (c) are process sectional views showing a part of a manufacturing method of a thin film transistor according to the fifth embodiment of the present invention;

FIGS. 19(a) to (e) are process sectional views showing a part of a manufacturing method of a thin film transistor formed on an active matrix substrate of a liquid crystal display panel according to the twelfth embodiment of the present invention;

BEST MODE FOR CARRYING OUT THE INVENTION

Figure 1:
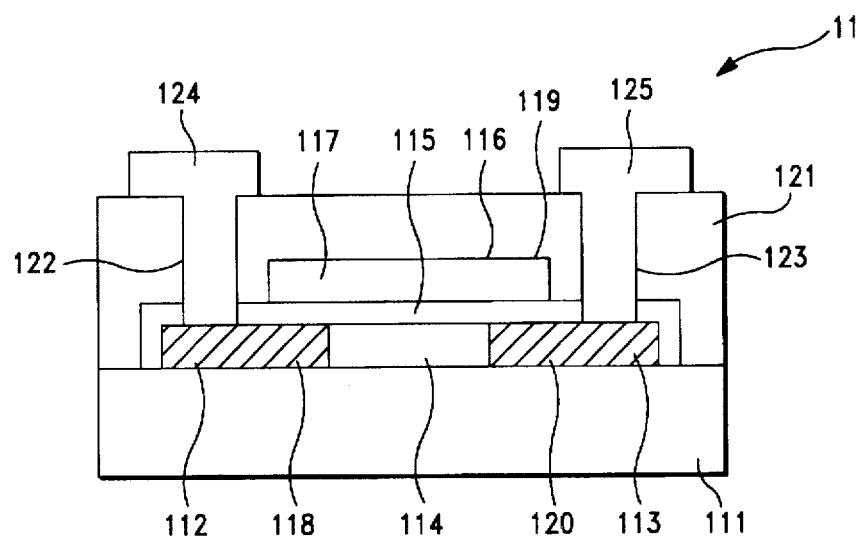
FIG. 1 is a sectional view showing a structure of a thin film transistor according to the first embodiment of the present invention.

A thin film transistor according to the present invention will be explained below with reference to the drawings.
First Embodiment FIG. 1 is a sectional view showing a constitution of a thin film transistor according to the present embodiment.

In this figure, a thin film transistor 110 of the present embodiment is formed on an insulation substrate 111 made from glass, quartz or sapphire and so on, and has on the face of the insulation substrate 111 an $n^-$ source area 112 and an $n^-$ drain area 113 consisting of an $n^-$ type silicon film (low concentration area) with the thickness of under about 500Å, for example, about 400Å, to which about $1 \times 10^{19}$ cm$^{-3}$ of phosphorus is added, and a channel-area 114 which lies between an $n^-$ source area 112 and an $n^-$ drain area 113 and connects these areas. The $n^-$ source area 112, the $n^-$ drain area 113 and the channel area 114 are silicon films made by crystallizing amorphous silicon, and because the $n^-$ source area 112, the $n^-$ drain area 113 and the channel area 114 are determined by the presence of impurities, the thickness of films of the $n^-$ source area 112, the $n^-$ drain area 113 and the channel area 114 are approximately the same, that is, about 400Å. On the surfaces of the $n^-$ source area 112, the $n^-$ drain area 113 and the channel-area 114, there are a gate insulation film 115 consisting of an insulation film such as a silicon oxidation film to cover them all, and a gate electrode 116 formed on the face of the gate insulation film 115. This gate electrode 116 is made from materials appropriate to the function of devices to be loaded with a thin film transistor 110, such as metal and a transparent electrically-conductive film. The gate electrode 116, the $n^-$ source area 112 and the $n^-$ drain area 113 are not made self-alignedly, and the overlapping area of one side end 117 of the gate electrode 116 and an end 118 of the $n^-$ source area 112, and that of the other side end 119 of the gate electrode 116 and the end 120 of the $n^-$ drain area 113 are relatively large. Note that 121 is an interlayer insulation film, through the contact holes 122 and 123 of which a source electrode 124 and a drain electrode 125 connect electrically-conductively to the $n^-$ source area 112 and the $n^-$ drain area 113.

In a thin film transistor 110 with such a structure, since an $n^-$ source area 112 and an $n^-$ drain area 113 are formed before a gate electrode 116 is formed, when implanted impurities are-activated in forming an $n^-$ source area 112 and an $n^-$ drain area 113, a gate electrode 116 is not formed yet. Accordingly, if an LCD of a large area or a high pixel density LCD is fabricated by employing a metal electrode with low sheet resistance, for instance, on the gate electrode 116, the heat resistance does not restrict the activation condition of the impurities implanted to the $n^-$ source area 112 and the $n^-$ drain area 113. In other words, as the impurities implanted to make the $n^-$ source area 112 and the $n^-$ drain area 113 can be activated sufficiently, and at the same time the crystalline state which was disturbed by the implantation of impurities can be restored enough, density of a trap energy level at the end 120 of the $n^-$ drain area 113 corresponding to the other side end 119 of a gate electrode 116 and its neighborhood can be reduced. And as the $n^-$ drain area 113 is a low concentration area, electric field strength is small near a gate electrode 116. Hence, the improvement of off current characteristics of a thin film transistor 110.

Moreover, an $n^-$ drain area 113 and its neighborhood are thin and are both about 400Å thick. The density of a trap energy level which may cause an off current tends to increase as a film becomes thick. Therefore, as the $n^-$ drain area 113 and its neighborhood are thin, the density of a trap energy level in the areas is decreased, which makes the off current reduce more. As can be seen in FIG. 2(a) where gate voltage-drain current characteristics of various thin film transistors in which an $n^-$ drain area 113 and its neighborhood are 400Å, are shown by a solid line L1, and in FIG. 2(b) where gate voltage-drain current characteristics of various thin film transistors in which a drain area and its neighborhood are 2000Å as a comparative embodiment, are shown by a solid line L2, it is confirmed that an off current is smaller in the embodiment in which a drain area and its neighborhood are thinner (400Å thick), and that off current characteristics of a thin film transistor according to the present embodiment are good.

Furthermore, in a thin film transistor 110 according to the present embodiment, an $n^-$ drain area 113 near an end of a gate electrode 116 is flat, hence a electric field convergence occurs less often between the other side end 119 of a gate electrode 116 and an end 120 of a drain electrode 113.

Figure 3A:
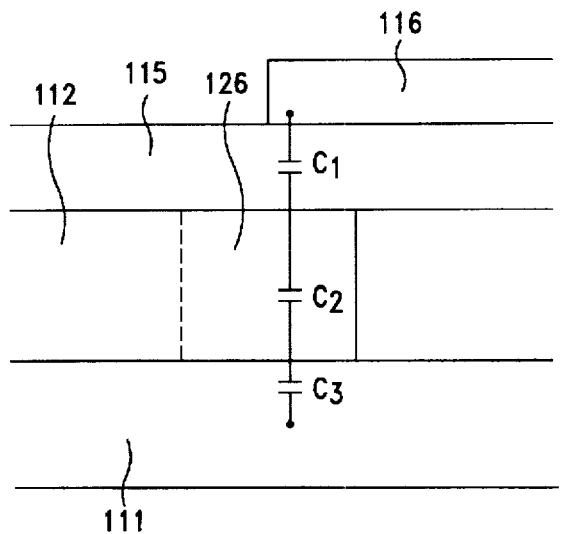
FIG. 3(a) is an illustration showing a parasitic capacitance of a thin film transistor shown in FIG. 1.
Figure 3B:
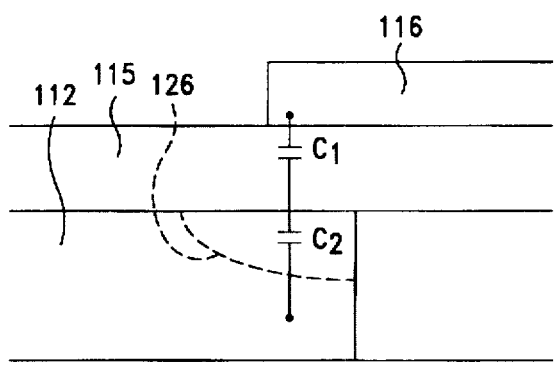
FIG. 3(b) is an illustration showing a parasitic capacitance of a thin film transistor according to the comparative embodiment.

In a thin film transistor 110 in the present embodiment, although an overlapping area of an $n^-$ source area 112, an $n^-$ drain area 113 and a gate electrode 116 is large, the amount of impurities implanted to an n⁻ source area 112 and an n-drain area 113 is about $1\times10^{19}$ cm$^{-3}$ while the thickness is about 400Å, therefore the parasitic capacitance between a gate electrode 116 and an n⁻ source area 112, for instance, is minimum. In other words, in this embodiment, noting that the thickness of a depletion layer created by a potential between a gate electrode 116 and an n⁻ source area 112 is determined by the impurity concentration of an n⁻ source area 112 if the potential is fixed, the thickness of an n⁻ source area 112 is set up so that a depletion layer may reach the lower face of an n⁻ source area 112. Explaining in detail, when a potential is applied to between a gate electrode 116 and an n⁻ source area 112, as shown in FIG. 3(a), the first capacity C1 corresponding to a gate insulation film 115, the second capacity C2 corresponding to a depletion layer 126, and the third capacity C3 corresponding to a side of a substrate 111 are connected in series, and their combined capacity is small. By contrast, when an n⁻ source area 112 is thick, as shown in FIG. 3(b), the lower face of a depletion layer 126 lies halfway in the thickness direction of an n⁻ source area 112, and only the first capacity C1 corresponding to a gate insulation film 115 and the second capacity C2 corresponding to a depletion layer 126 are connected in series, so their combined capacity is big. Note that here the thickness of an n⁻ source area 112 is set up at about 400Å according to the impurity concentration, $1\times10^{19}$ cm$^{-3}$ but that the thickness of an n⁻ source area 112 can be set up so that a depletion layer 126 may reach the lower face of an n⁻ source area 112 (side of a substrate 111) according to the impurity concentration. Concretely, an n⁻ source area 112 may sometimes be as thin as about 100Å, considering the limitation of a process on control of impurity concentration.

Next, referring to FIGS. 4(a) to (d), a manufacturing method of a thin film transistor in this embodiment will be explained.

FIGS. 4(a) to (d) are all process sectional views showing a part of a manufacturing method of a thin film transistor in this embodiment.

Figure 4A:
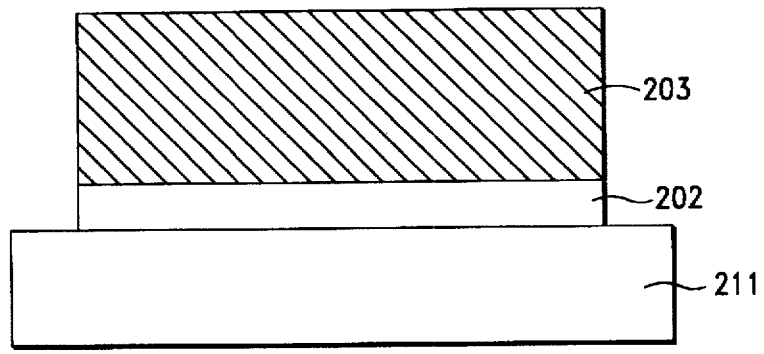
FIGS. 4(a) to (d) are process sectional views showing a part of a manufacturing method of a thin film transistor shown in FIG. 1.

First, as is shown in FIG. 4(a), on the surface of an insulation substrate 211, a resist pattern 203 is formed employing a photolithography technique after an amorphous silicon film is built up in a low-temperature process, for instance, a sputtering process or an LPCVD method in an atmosphere of the temperature of 550° C. to 600° C., and by patterning the amorphous silicon film to form a pattern 202 (amorphous silicon film). Note that although it is possible to inject impurities after an amorphous silicon film is crystallized by the irradiation of a laser beam, the implantation of impurities causes the crystalline state to be disturbed, therefore another restoration treatment will be necessary. Accordingly, in this embodiment, after the implantation of impurities, a crystallization treatment is performed, which activates the impurities at the same time.

Figure 4B:
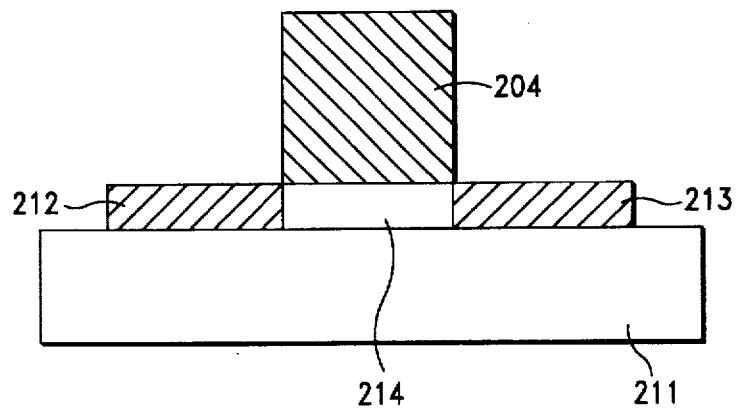

That is, after an amorphous silicon film is patterned, a resist pattern 203 is removed, and as is shown in FIG. 4(b), after another resist pattern 204 is formed, using 204 as a mask, by ion implanting phosphorus, an n⁻ source area 212 (low concentration area) and an n⁻ drain area 213 (low concentration area) having an impurity concentration of about $5\times10^{18}$ cm$^{-3}$ are formed. Of a pattern 202 of an amorphous silicon film, an area to which phosphorus was not implanted becomes a channel area 214.

Then, after a resist pattern 204 is removed, an amorphous silicon film (pattern 202) is annealed by irradiating a laser beam to polycrystallize the amorphous silicon film and to activate the impurities implanted to it simultaneously.

Alternatively, an amorphous silicon film is annealed for about four hours in a nitrogen atmosphere of the temperature of about 600° C., for example, (solid phase crystallization method: SPC method) to crystallize the amorphous silicon film and simultaneously to activate the impurities implanted to it. In this case, according to the necessity, a plasma hydrogen treatment is performed in an atmosphere of the temperature of 350° C., or an amorphous silicon film is rapid-thermal-annealed both to crystallize the amorphous silicon film and to activate the impurities implanted to it.

Figure 4C:
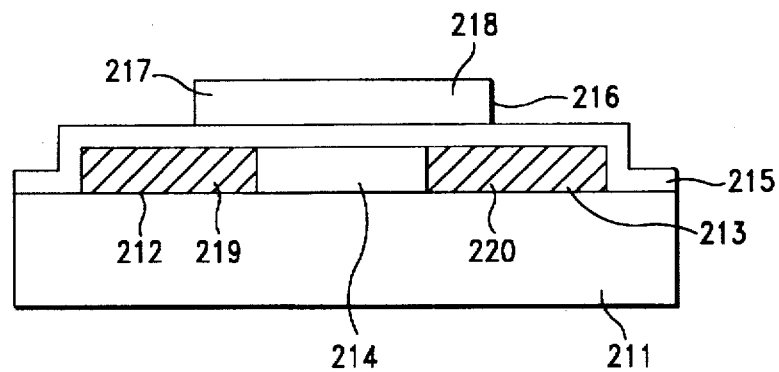

Next, as is shown in FIG. 4(c), after a gate insulation film 215 is formed on the surface of an amorphous silicon film (an n⁻ source area 212, an n⁻ drain area 213, and a channel area 214), a gate electrode 216 made from such a material as metal on the surface of the gate insulation film 215. The side ends 217 and 218 of the gate electrode 216 confront the ends 219 and 220 of the n⁻ source area 212 and the n⁻ drain area 213.

Figure 4D:
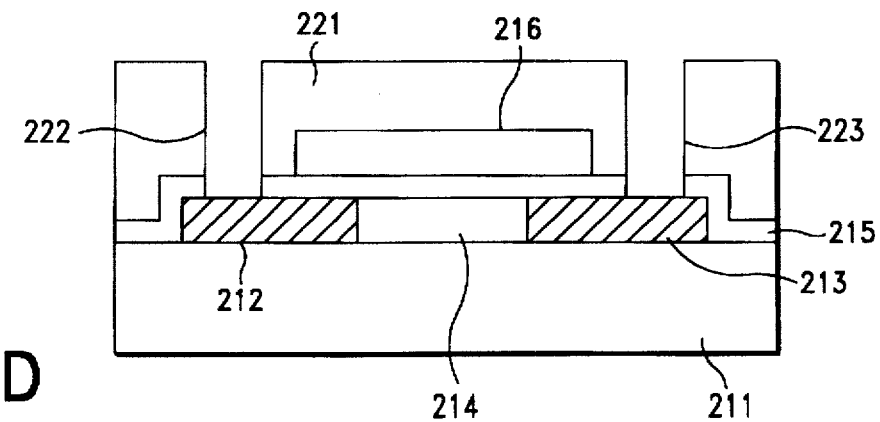

Subsequently, as is shown in FIG. 4(d), after an interlayer insulation film 221 is formed on the surface of a gate electrode 216, contact holes 222 and 223 are made on it, and using these contact holes 222 and 223, as shown in FIG. 1, a source electrode 124 and a drain electrode 125 are connected to an n⁻ source area 212 and a drain electrode 213 respectively to fabricate a thin film transistor 110.

As is clear from the above discussion, in a manufacturing method of a thin film transistor 110 according to this embodiment, after impurities are implanted to a silicon film such as an amorphous silicon film, a crystallization treatment is performed on an amorphous silicon film, and the crystallization treatment itself activates the impurities at the same time. Furthermore, because in subsequent processes, impurities are not implanted, processes are simplified and the silicon film after the crystallization treatment, whose crystalline state is not broken by the injection of impurities, density of a trap energy level does not increase, hence a thin film transistor 110 whose off current characteristics are good can be manufactured efficiently. Note that the silicon film can be a polycrystalline silicon film instead of the amorphous silicon film used in this embodiment.

Second Embodiment

With reference to FIGS. 5 (a) to (c), a thin film transistor according to the second embodiment of the present invention and its manufacturing method will be explained below.

FIGS. 5 (a) to (c) are process sectional views showing a part of a manufacturing process of a thin film transistor in this embodiment.

Figure 5A:
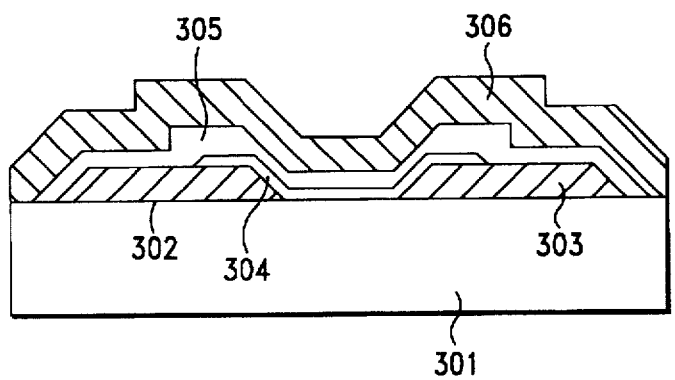
FIGS. 5(a) to (c) are process sectional views showing a part of a manufacturing method of a thin film transistor according to the second embodiment of the present invention.
Figure 5B:
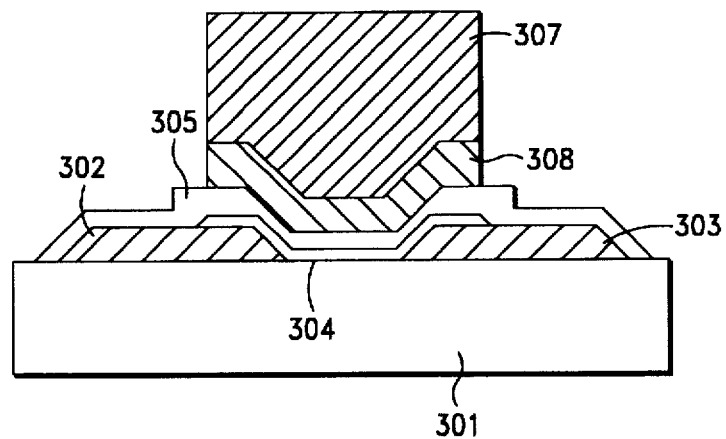
Figure 5C:
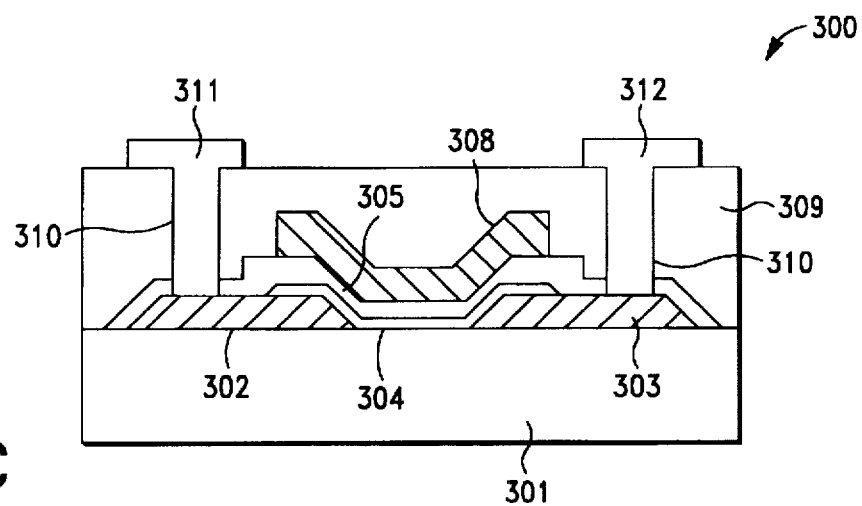

A thin film transistor in the present embodiment, like a thin film transistor according to the first embodiment, has a structure shown in FIG. 5(c) to improve on-off characteristics.

A thin film transistor 300 has, on the face of an insulation substrate 301 made from glass, quartz, sapphire and so on, an n⁻ source area 302 (low concentration area) and an n⁻ drain area 303 (low concentration area) to which about $1\times10^{20}$ cm$^{-3}$ of phosphorus is added, and on their surfaces the transistor 300 has a channel-forming area 304 consisting of a thin film made from silicon such as polycrystalline silicon of the thickness of about 1000Å in such a way as to connect an n⁻ source area 302 and an n⁻ drain area 303. And on the surfaces of an n⁻ source area 302, a channel area 304 and an n⁻ drain area 303, there is a gate insulation film 305 such as a silicon oxidation film. An end of a gate electrode 308 on the surface of 305 overlaps an n⁻ source area 302 and an n⁻ drain area 303 through a gate insulation film 305.

In order to manufacture a thin film transistor 300 of such a structure, first, as is shown in FIG. 5(a), after an n⁻ silicon thin film made from such materials as polycrystalline silicon to which about 1×10²⁰ cm⁻³ of phosphorus, for instance, is added is built up about 1500Å on the face of an insulation substrate 301, the n- silicon thin film is etched selectively to form an n- source area (low concentration area) and an n⁻ drain area 303 (low concentration area). Subsequently, on the faces of an n⁻ source area 302 and an n⁻ drain area 303, a channel area 304 consisting of a silicon thin film made from such materials as polycrystalline silicon of the thickness of about 1000Å is formed to connect 302 and 303. Then the whole device is thermal oxidated to form a gate insulation film 305 consisting of a silicon oxidation film, on the surface of which a gate electrode material 306 is formed consisting of metal, a transparent electrically-conductive film, a polycrystalline silicon film to which impurities are added, and so on.

As is shown in FIG. 5(b), of the surface of a gate electrode material 306, on the area on which a gate electrode is to be made, a resist pattern 307 is formed employing such a technique as a photolithography technique, and with 307 used as a mask, a gate electrode material 306 is etched selectively to form a gate electrode 308. An end of a gate electrode 308 overlaps an end of an n⁻ source area 302 and an end of an n⁻ drain area 303 through a gate insulation film 305.

Then a registration pattern 307 is removed. After that, as is shown in FIG. 5(c), an interlayer insulation film 309 consisting of a silicon oxidation film is formed as in a usual process. After a contact hole 310 is formed in an interlayer insulation film 309, a source electrode 311 and a drain electrode 312, consisting of metal, a transparent electrically-conductive film and so on, are connected to an n⁻ source area 302 and an n⁻ drain area 303, respectively.

As is clear from the above explanation, in a thin film transistor 300 in the present embodiment, as in a thin film transistor according to the first embodiment, since an n⁻ source area 302 and an n⁻ drain area 303 are formed before a gate electrode 308 is formed, an n⁻ source area 302 and an n⁻ drain area 303 can be formed in an ideal condition without being restricted by the heat resistance of materials to constitute a gate electrode 308. Hence, the improvement of off current characteristics.

Third Embodiment

With reference to FIGS. 6(a) to (d), a thin film transistor according to the third embodiment of the present invention and its manufacturing method will be explained below.

FIGS. 6(a) to (d) are process sectional views showing a part of a manufacturing process of a thin film transistor in this embodiment.

A thin film transistor in this embodiment, compared to a thin film transistor according to the first embodiment, aims at improving on current characteristics in addition to the improvement of off characteristics by forming areas of different concentrations in a source area and a drain area. As is shown in FIG. 6(d), the transistor has, on the surface of an insulation substrate 401 made from such materials as glass, an n+ source area 412 (low resistance area of high concentration) and an n⁻ source area 405 (low concentration area) on the source area side, and an n⁻ drain area 413 (low resistance area of high concentration) and an n⁻ drain area 406 (low concentration area) on the drain area side. An end of a gate electrode 409 overlaps an end of an n⁻ source area 405 and an end of an n⁻ drain area 406 of low concentration through a gate insulation film 408, while a source electrode 420 and a drain electrode 421 connect to an n⁻ source area 412 and an n⁻ drain area 413 of high concentration.

Figure 6A:
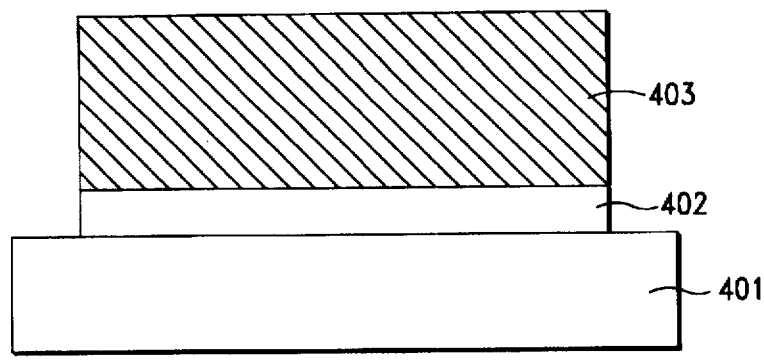
FIGS. 6(a) to (d) are process sectional views showing a part of a manufacturing method of a thin film transistor according to the third embodiment of the present invention.

In order to manufacture a thin film transistor 400 of such a structure, first, as is shown in FIG. 6(a), about 1500Å of a silicon thin film, made from polycrystalline silicon and so on, is built up on an insulation substrate 401 made from such materials as glass.

Subsequently, a resist pattern 403 is formed employing such a technique as a photolithography technique, and with 403 used as a mask, a silicon thin film is etched selectively to form a silicon pattern 402.

Figure 6B:
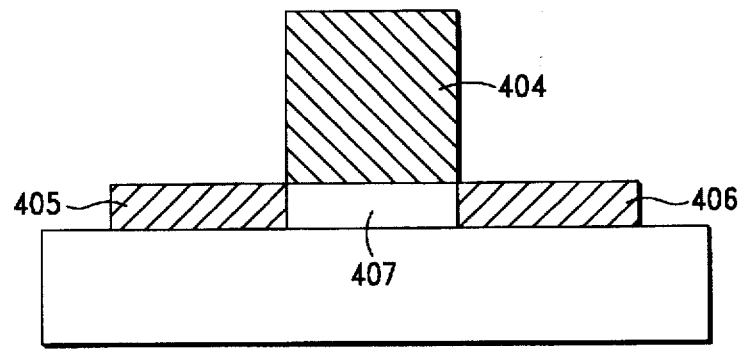

Second, after a resist pattern 403 is removed, as is shown in FIG. 6(b), a new resist pattern 404 is formed employing such a technique as a photolithography technique, and with the pattern 404 used as a mask, phosphorus is ion implanted to form an n⁻ source area 405 and an n⁻ drain area 406 of about 1×10¹⁸ cm⁻³. An area on which an ion implantation was not performed becomes a channel area 407.

Figure 6C:
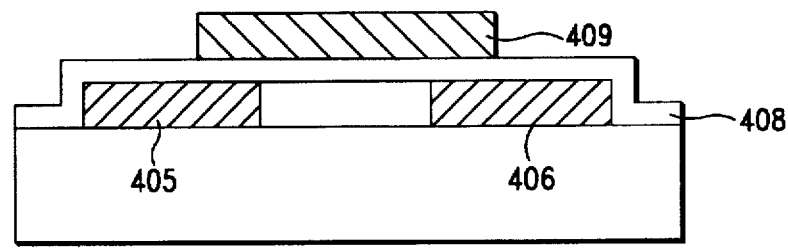
Figure 6D:
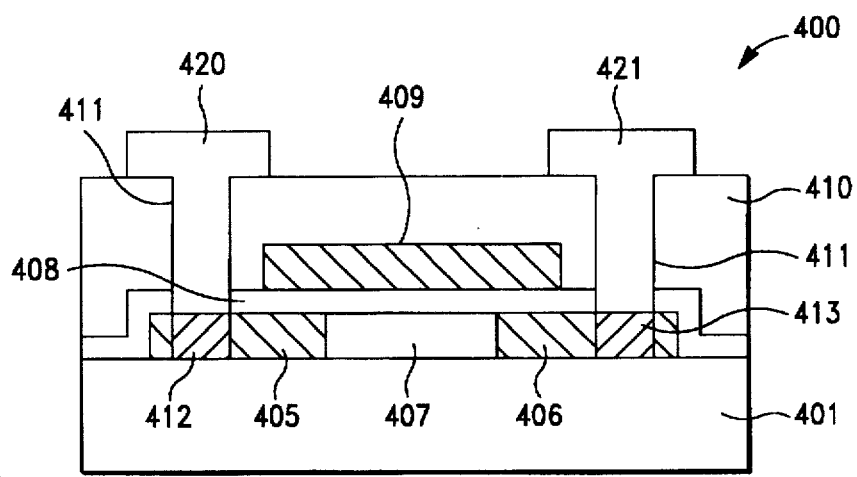

Third, after a resist pattern 404 is removed, the whole device is thermal oxidated to-form a gate insulation film 408 consisting of a silicon oxidation film, as is shown in FIG. 6(c). This heat-treating process also has an effect of activating the implanted ions. Then a gate electrode 409 is formed consisting of metal, a transparent electrically-conductive film, a polycrystalline silicon film to which impurities are added, and so on. A gate electrode 409 overlaps a part of an n⁻ source area 405 and an n⁻ drain area 406 through a gate insulation film 408.

Fourth, as is shown in FIG. 6(d), after an interlayer insulation film 410 consisting of a silicon oxidation film is formed, contact holes 411 are formed in it. Then with an interlayer insulation film 410 used as a mask, phosphorus is ion implanted. At the same time the implanted ions are activated by irradiating a laser beam to form an n⁻ source area 412 and an n+drain area 413 of about 5×10²¹ cm⁻³.

Subsequently, as in a usual manufacturing method, a source electrode 420 and a drain electrode 421, consisting of metal, a transparent electrically-conductive film and so on, are connected to their respective n⁻ source area 412 and n⁻ drain area 413.

In a thin film transistor 401 of such a structure, an n⁻ source area 405 and an n⁻ drain area 406 overlapping an end of a gate electrode 409 are formed before a gate electrode 409 is formed. Accordingly, if a gate electrode 409 is made from such materials as metal, the impurities implanted to an n⁻ source area 405 and an n⁻ drain area 406 can be activated sufficiently without being restricted by the heat resistance of the material, and at the same time the crystalline state disturbed by the implanted impurities can be restored enough, hence density of a trap energy level can be reduced at an end of an n⁻ drain area 406 and in its neighborhood. And since an n⁻ drain area 406 is a low concentration area, electric field strength is small near a gate electrode 409. Hence, the improvement of off current characteristics of a thin film transistor 401.

Furthermore, of a source area and a drain area, the area which can influence such features as on-off characteristics is a low concentration area, while the area to which a source electrode 420 and a drain electrode 421 connect is a high concentration area, therefore parasitic resistance is low and a strong on current can be obtained.

Fourth Embodiment

Instead of a thin film transistor according to the third embodiment, a thin film transistor illustrated in FIG. 7 can achieve an improvement of on-off characteristics and an on current.

FIG. 7 is a sectional view of a thin film transistor in this embodiment in the channel direction. A thin film transistor 430 has a pattern consisting of a silicon thin film made from such materials as polycrystalline silicon on the surface of an insulation base 431 made from glass, quartz, sapphire and so on, and this pattern has an n⁻ source area 432 and an n⁻ drain area 433 containing about 5×10²⁰ cm⁻³ of boron, an n⁻ source area 434 and an n- drain area 435 containing about 5×10¹⁸ cm⁻³ of boron, and a channel-forming area 436 containing about 1×10¹⁷ cm⁻³ of boron. On their surface, there is a gate insulation film 437 consisting of an insulation film such as a silicon insulation film, on the surface of which there is a gate electrode 438 consisting of metal, a transparent electrically-conductive film and so on. An end of a gate electrode 438 overlaps ends of an n⁻ source area 434 and an n⁻ drain area 435 through a gate insulation film 437. On their face, there is an interlayer insulation film 439 consisting of an insulation film such as a silicon oxidation film, and contact holes 440 are formed in it. A source electrode 441 and a drain electrode 442, consisting of metal, a transparent electrically-conductive film and so on, connect to an n⁻ source area 432 an n⁻ drain area 433 through the contact holes 440 formed in 439.

In a thin film transistor 430 of such a structure, though the explanation of its manufacturing method is omitted, since an n⁻ source area 434 and an n⁻ drain area 435 overlapping an end of a gate electrode 438 are formed before a gate electrode 438 is formed, if a gate electrode 438 is made from such materials as metal, the impurities implanted to an n⁻ source area 434 and an n- drain area 435 can be activated sufficiently without being restricted by the heat resistance of the material. It also has an advantage that the crystalline state which was disturbed by the implanted impurities can be restored enough.

Furthermore, of a source area and a drain area, the area that can influence such features as on-off characteristics is a low concentration area, while there is also a high concentration area (an n⁻ source area 432 and an n⁻ drain area 433), therefore parasitic resistance is low and a strong on current can be obtained.

Fifth Embodiment

Next, with reference to FIGS. 8(a) to (c), a thin film transistor according to the fifth embodiment of the present invention and its manufacturing method will be explained.

FIGS. 8(a) to (c) are process sectional views showing a part of a manufacturing process of a thin film transistor in this embodiment.

A thin film transistor in this embodiment, compared to a thin film transistor according to the second embodiment, by forming areas of different concentrations in a source area and a drain area, the improvement of on current characteristics as well as the improvement of off characteristics is intended. As is shown in FIG. 8(c), of the surface of an insulation substrate 453 made from glass and so on, a thin film transistor 450 has on the source area side an n⁻ source area 458 (high concentration area) containing about 1×10²¹ cm⁻³ of boron and an n⁻ source area 482 (low concentration area) containing about 1×10¹⁹ cm⁻³ of boron, and on the drain area side, an n⁻ drain area 459 (high concentration area) containing about 1×10²¹ cm⁻³ of boron and an n⁻ drain area-451 (low concentration area) containing about 1×10¹⁹ cm⁻³ of boron. An end of a gate electrode 456 overlaps an n⁻ source area 452 and an n⁻ drain area 451 of low concentration through a gate insulation film 455, while a source electrode 462 and a drain electrode 463 connect to an n⁺ source area 458 and an n⁺ drain area 459 of high concentration.

In order to fabricate a thin film transistor 450 of such a structure, first, as is shown in FIG. 8(a), a silicon thin film of low concentration, made from polycrystalline silicon and so on, and of the thickness of about 1500Å, to which about 1×10¹⁹ cm⁻³ of boron is added, is formed on an insulation substrate 453 made from glass, quartz, sapphire and so on. Then by etching the silicon thin film selectively, a p⁻ source area 452 and a p⁻ drain area 451 are formed.

On the faces of a p⁻ source area 452 and a p⁻ drain area 451, a channel area 454 consisting of a silicon thin film made from such materials as polycrystalline silicon whose thickness is 250 Å is formed in such a way as to connect 452 and 451. Then, a gate insulation film 455 consisting of a silicon oxidation film is formed on the whole surface by employing an ECR-CVD method. And a gate electrode 456 is formed consisting of metal, a transparent electrically-conductive film, polycrystalline silicon film to which impurities are added, and so on. An end of a gate electrode 456 overlaps an end of a p⁻ source area 452 and an end of a p⁻ drain area 453 through a gate insulation film 455.

Then, as is shown in FIG. 8(b), a resist pattern 457 is formed to cover a fixed area of a p⁻ source area 452 and a p⁻ drain area 453 employing such a technique as a light exposure technique. With the pattern 457 used as a mask, boron is ion implanted. And impurities are activated by irradiating a laser beam.

A resist pattern 457 is removed. Afterwards, as in a usual process, as is shown in FIG. 8(c), after an interlayer insulation film 460 consisting of a silicon oxidation film is formed, a contact hole 461 is formed in it. Then a source electrode 462 and a drain electrode 463, consisting of metal, a transparent electrically-conductive film and so on, are connected to a p⁻ source area 458 and a p⁻ drain area 453, respectively.

In a thin film transistor 450 fabricated in this way, because a p⁻ source area 452 and a p⁻ drain area 453 are formed before a gate electrode 456 is formed, it has effects similar to those of a thin film transistor according to the second embodiment. Furthermore, since a p⁻ source area 458 and a p⁻ drain area 459 are formed, a transistor 450 has small parasitic resistance and can get a large on current.

Sixth Embodiment

Figure 9:
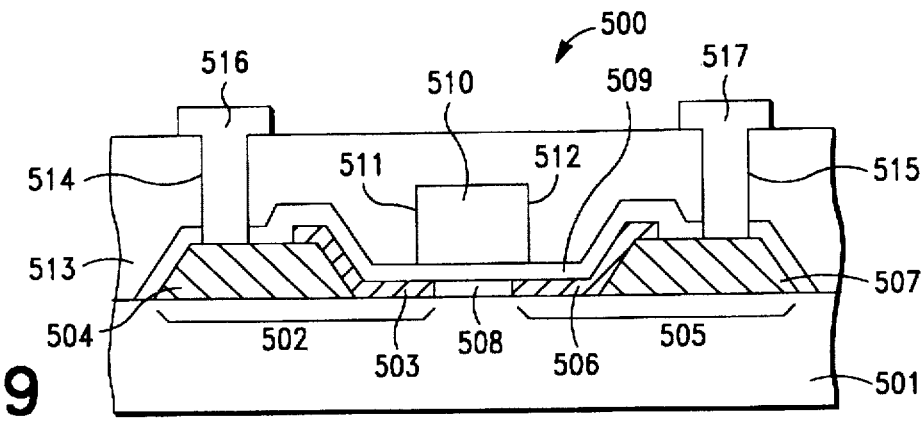
FIG. 9 is a sectional view showing a structure of a thin film transistor according to the sixth embodiment of the present invention.

FIG. 9 is a sectional view showing a structure of a thin film transistor according to the sixth embodiment of the present invention.

In this figure, a thin film transistor 500 in this embodiment is also formed on an insulation substrate 501 made from glass, quartz, sapphire and so on, and its source area 502 has a p⁻ source area 503, which is a p⁻ silicon film of the thickness of about 500Å to which about 1×10¹⁸ cm⁻³ of boron is added, and a p+ source area 504 (thick, low resistance area of high concentration), which is a p⁻ silicon film of the thickness of about 2000Å to which about 1×10²¹ cm⁻³ of boron is added. A drain area 505, on the other hand, has a p⁻ drain area 506, which is a p- silicon film of the thickness of about 500 Å to which about 1×1012 cm⁻³ of boron is added, and a p⁻ drain area 507 (thick, low resistance area of high concentration), which is a p⁻ silicon film to which about 1×10²¹ cm⁻³ of boron is added and which has the thickness of about 2000ÅA . Between a source area 502 and a drain area 505, there are a channel area 508, consisting of a silicon film and so on, formed in such a way as to connect to the areas 502 and SOS, a gate insulation film 509, consisting of an insulation film such as a silicon oxidation film to cover the whole areas, and a gate electrode 510, constituted by such materials as metal and a transparent electrically-conductive film formed on the surface of this gate insulation film 509. A gate electrode 510, a source area 502 and a drain area 505 are not formed in a self-aligned way, and one side end 511 of a gate electrode 510 and a p⁻ source area 503 (end) of a source area 502 confront with a relatively large overlapping area. Similarly, the other side end 512 of a gate electrode 510 and a p⁻ drain area 506 (end) of a drain area 505 confront with a relatively large overlapping area. 513 is an interlayer insulation film. A source electrode 516 and a drain electrode 517 connect electrically-conductively to a p⁻ source area 504 of a source area 502 and a p⁻ drain area 507 of a drain area 505 through contact holes 514 and 515 in the interlayer insulation film 513.

In a thin film transistor 500 of such a structure, since it is a p⁻ drain area 506 that confronts a gate electrode 510 on the side of a drain area 505, for example, electric field strength is small near a gate electrode 510. Hence the improvement of off current characteristics. A source area 502 and a drain area 505 are not constituted in a self-aligned way to a gate electrode 510. In other words, a source area 502 and a drain area 505 are not formed by an ion implantation with a gate electrode 510 used as a mask, but a source area 502 and a drain area 505 are formed before a gate electrode 510 is formed, therefore impurities implanted to a source area and a drain area can be activated without being restricted by the-heat resistance limit of a gate electrode, even if the heat resistance of a gate electrode 510 is as low as 600° C., for instance. Accordingly, since the crystalline state which was disturbed by the implantation of impurities can be restored sufficiently density of a trap energy level of a drain area 505 corresponding to an end of a gate electrode 510 and its neighborhood can be reduced. Hence the further improvement of off current characteristics of a thin film transistor 500.

A manufacturing method of a thin film transistor of such a structure will be explained referring to FIGS. 10(a) to (c).

Figure 10A:
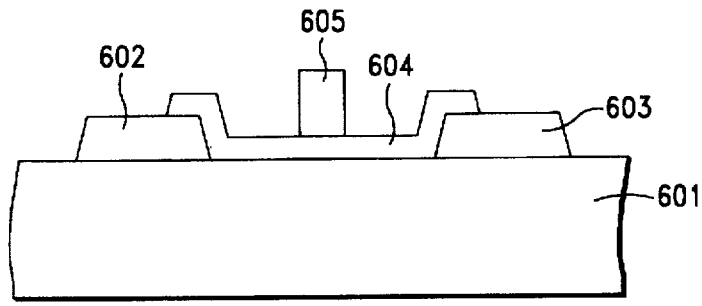
FIGS. 10(a) to (c) are process sectional views showing a part of a manufacturing method of a thin film transistor shown in FIG. 9.
Figure 10B:
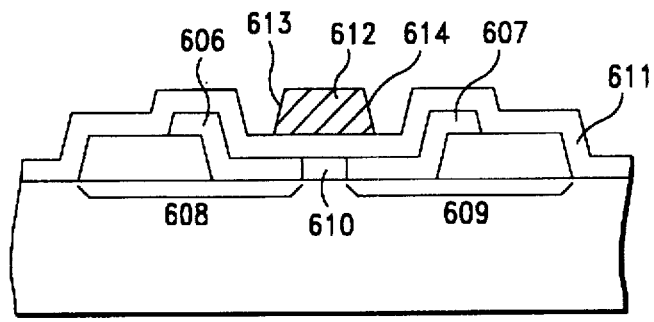
Figure 10C:
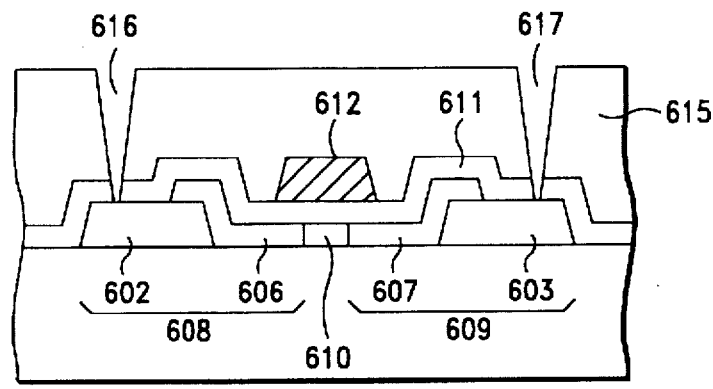

FIGS. 10(a) to (c) are process sectional views showing a part of a manufacturing method of a thin film transistor in this embodiment.

First, as is shown in FIG. 10(a), on an insulation substrate 601 made from glass, quartz, sapphire and so on, about 2000Å of an amorphous silicon thin film to which about 1×10²⁰ cm⁻³ of boron is added, for instance, is built up in a low-temperature process. By etching the amorphous silicon thin film selectively, p⁻ areas 602 and 603 are formed.

Second, on the surface of p⁺ areas 602 and 603, about 250Å of an amorphous silicon film 604 is formed in such a way as to connect these areas. Then a registration pattern 605 is formed on 604.

Third, as is shown in FIG. 10(b), with a resist pattern 605 used as a mask, p⁻ areas 606 and 607 of the concentration of about 5×10¹⁷ cm⁻³ are formed by ion implantation of boron, for instance.

A p⁻ area 602 and a p⁻ area 606 become a source area 608, while a p⁻ area 603 and a p⁻ area 607 become a drain area 609. And the area to which ions were not implanted, because of the masking of a resist pattern 605, becomes a channel area 610.

Fourth, after a resist pattern 605 is stripped, in a nitrogen atmosphere of the temperature of about 600° C., for instance, by performing an annealing for about four hours (solid phase crystallization method: SPC method), an amorphous silicon film is crystallized, and at the same time the impurities implanted to p+ areas 602 and 603 and p⁻ areas 606 and 607 are activated.

Fifth, in an ECR-CVD method, a gate insulation film 611 consisting of a silicon oxidation film is formed on the whole surface.

Sixth, a gate electrode material made from such materials as metal is built up on the face of a gate insulation film 611, and by etching selectively the gate electrode material employing such a technique as a light exposure technique, a gate electrode 612 is formed. In forming a gate electrode 612 by etching, one side end 613 and the other side end 614 of a gate electrode 612 should be made to overlap one side end of p⁻ areas 606 and 607.

Subsequently, following a usual process, as is shown in FIG. 10(c), after an interlayer insulation film 615 consisting of a silicon oxidation film, and contact holes 616 and 617 are formed, a source electrode which electrically-conductively connects to a high concentration area of a source area (p⁻ area 602), and a drain electrode which electrically-conductively connects to a high concentration drain area of a drain area (p⁻ area 603) are formed to constitute a thin film transistor 500 illustrated in FIG. 9.

Seventh Embodiment

With reference to FIGS. 11(a) to (e), one embodiment of a semiconductor device equipped with a CMOS circuit consisting of a thin film transistor according to the first to sixth embodiments will be explained below.

Figure 11A:
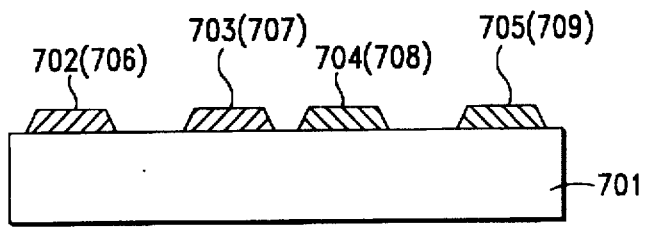
FIGS. 11(a) to (e) are process sectional views showing a part of a manufacturing method of a CMOS circuit (semiconductor device) equipped with a thin film transistor according to the seventh embodiment of the present invention.
Figure 11B:
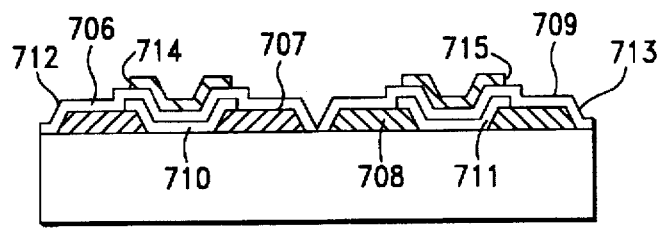
Figure 11C:
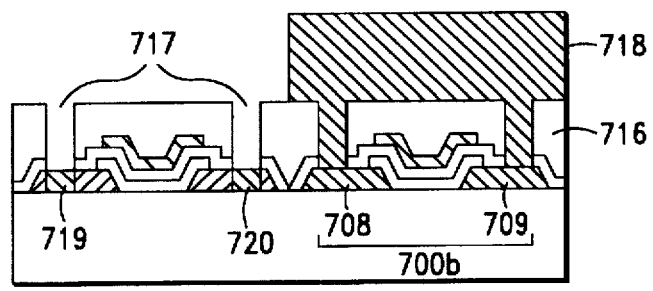
Figure 11D:
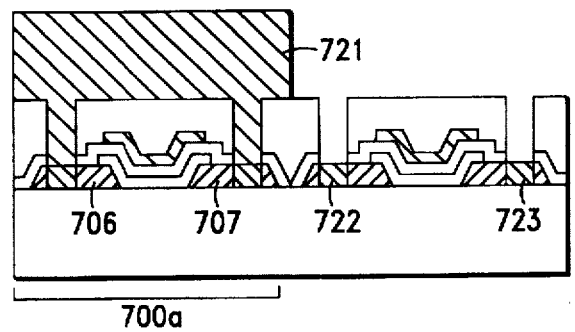
Figure 11E:
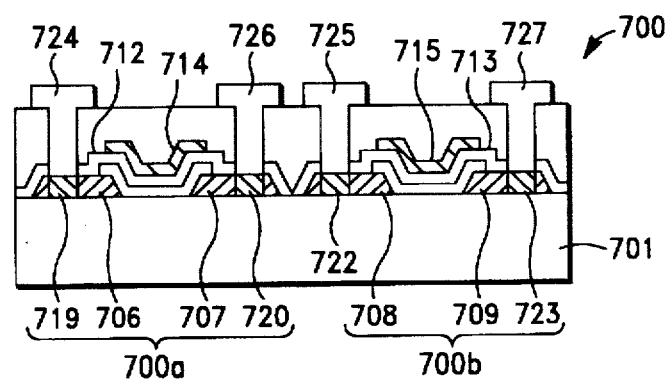

As is shown in FIG. 11(e), a CMOS circuit 700 of a semiconductor device in this embodiment has an n-channel type thin film transistor 700a and a p-channel type thin film transistor 700b on the surface of the same insulation substrate 701 made from such materials as glass, quartz and sapphire. In any thin film transistor, it is an n⁻ source area 706, an n⁻ drain area 707, a p⁻ source area 708 and a p⁻ drain area 709 (low concentration areas) that ends of gate electrodes 714 and 715 overlap through gate insulation films 712 and 713. On the other hand, it is an n⁺ source area 719, a p⁻ source area 722, an n⁺ drain area 720 and a p⁻ drain area 723 (high concentration areas) that source electrodes 724 and 725 and drain electrodes 726 and 727 connect to.

In order to manufacture a CMOS circuit 700 of such a structure, first, as is shown in FIG. 11(a), on the surface of an insulation substrate 701 made from such materials as glass, quartz and sapphire, a silicon thin film of the thickness of about 700Å made from polycrystalline silicon and so on, is formed. Then by selectively etching the thin film, patterns 702, 703, 704, and 705 of a silicon thin film are formed. Afterwards, in a well-known method, phosphorus is ion implanted to patterns 702 and 703 of a silicon thin film to make the patterns about 5×10¹⁸ cm⁻³ of an n⁻ source area 706 and an n⁻ drain area 707, respectively. On the other hand, boron is ion implanted to patterns 704 and 705 of a silicon thin film to make the patterns about 5×10¹⁸ cm⁻³ of a p⁻ source area 708 and a p⁻ drain area 709, respectively.

Then, as is shown in FIG. 11(b), channel-forming areas 710 and 711, consisting of a silicon thin film of the thickness of about 1000Å made from such materials as polycrystalline silicon, are formed so that an n⁻ source area 706 and an n⁻ drain area 707, and a p⁻ source area 708 and a p⁻ drain area 709, are connected respectively. And the whole device is thermal oxidated to form gate insulation films 712 and 713 consisting of a silicon oxidation film. This thermal oxidation treatment has an effect of activating impurities in an n⁻ source area 706, an n⁻ drain area 707, a p⁻ source area 708 and a p⁻ drain area 709 to which ions were implanted. Next, gate electrodes 714 and 715, consisting of metal, a transparent electrically-conductive film, polycrystalline silicon to which impurities are added, and so on, are formed on gate insulation films 712 and 713. Ends of gate electrodes 714 and 715 overlap ends of an n⁻ source area 706, an n⁻ drain area 707, a p⁻ source area 708 and a p⁻ drain area 709 through gate insulation films 712 and 713.

As is shown in FIG. 11(c), after an interlayer insulation film 716 consisting of a silicon oxidation film is formed, contact holes 717 are formed in it. Then employing such a technique as a photolithography technique, a resist pattern 718 to cover the side of a p⁻ source area 708 and a p⁻ drain area 709 (the side of a p-channel type thin film transistor 700b) is formed. With the regist pattern 718 and an interlayer insulation film 716 used as masks, about $5\times10^{21}$ cm$^{-3}$ of an n$^-$ source area 719 and an n+ drain-area 720 are formed by ion implantation of phosphorus.

After a resist pattern 718 is removed, as is shown in FIG. 11(d), employing such a technique as a photolithography technique, a resist pattern 721 to cover the side of an n$^-$ source area 706 and an n$^-$ drain area 707 (the side of an n-channel type thin film transistor 700a) is formed. With the regist pattern 721 and an interlayer insulation film 716 used as masks, about $5\times10^{21}$ cm$^{-3}$ of a p+ source area 722 and a p$^+$ drain area 723 are formed by ion implantation of boron.

After a resist pattern 721 is removed, respective impurities which were ion implanted are activated by irradiating a laser beam. After that, as is shown in FIG. 11(e), as in a usual process, source electrodes 724 and 725 and drain electrodes 726 and 727, consisting of metal, a transparent electrically-conductive film and so on, are connected to an n$^+$ source area 719, a p$^+$ source area 722, an n$^-$ drain area 720 and a p$^+$ drain-area 723, respectively.

An n-channel type thin film transistor 700a and a p-channel type thin film transistor 700b formed on the same insulation substrate 701 have improved off current characteristics and on current characteristics.

Eighth Embodiment

A structure of an active matrix substrate with peripheral circuits of a liquid crystal display panel built-in as a typical device equipped with a thin film transistor will be explained below as the eighth embodiment of the present invention.

Figure 12:
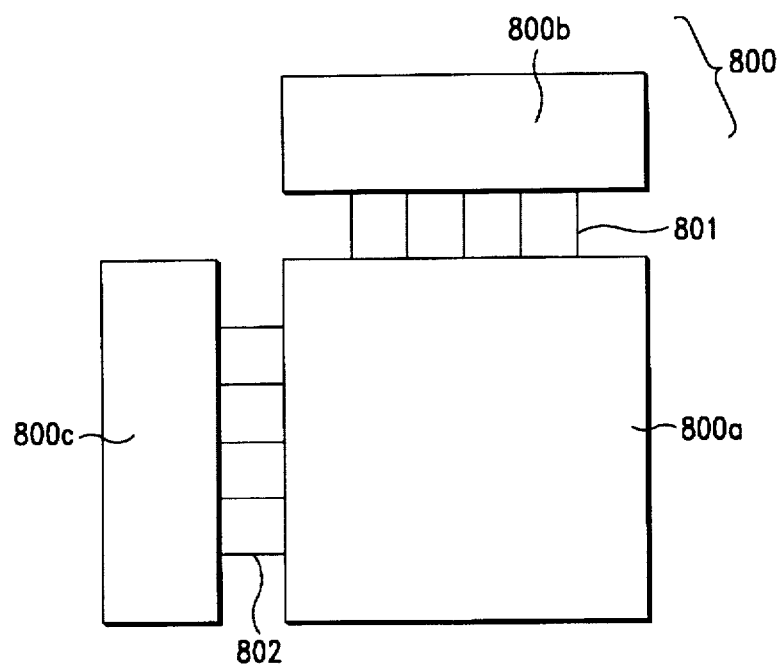
FIG. 12 is a block diagram showing a constitution of a liquid crystal display panel.
Figure 13:
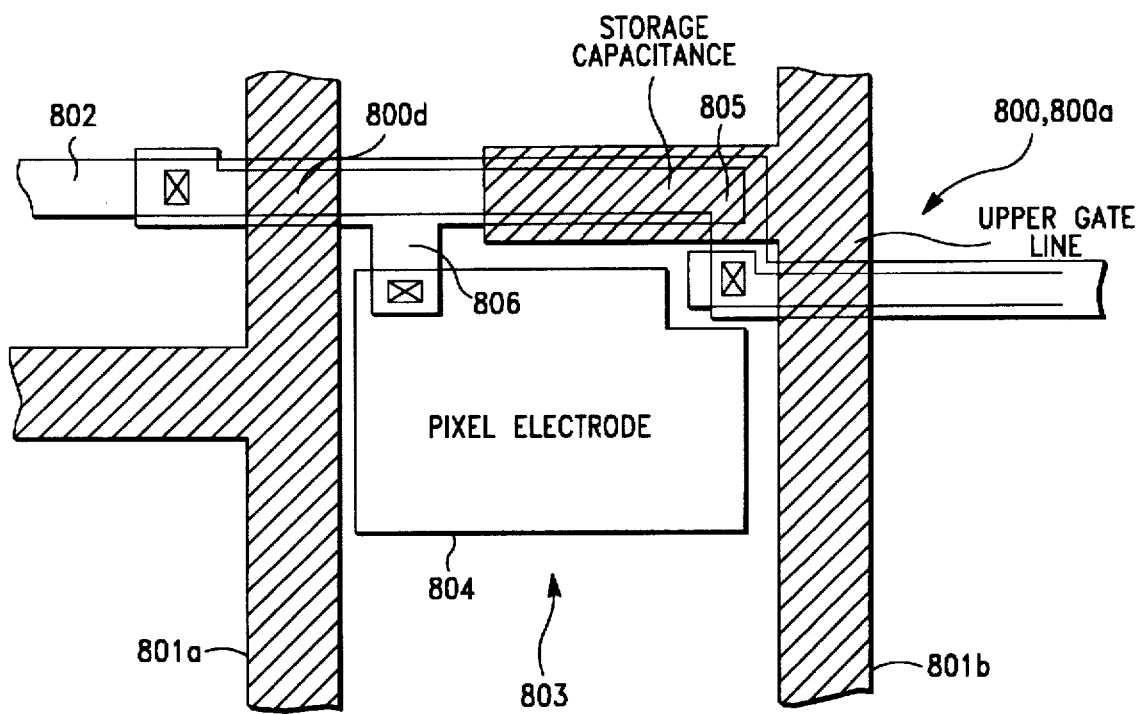
FIG. 13 is a plan view showing a constitution of each pixel area in a pixel part of a liquid crystal display panel shown in FIG. 12.

FIG. 12 is a block diagram showing a whole constitution of an active matrix substrate in this embodiment. As is shown in the figure, an active matrix substrate 800 is divided into a pixel part 800a and peripheral circuit parts 800b and 800c (drive circuit parts). In a pixel part 800a, as is shown in FIG. 13, a pixel area 803 is sectioned by scanning lines (gate lines) 801a and 801b (801) connected to a peripheral circuit part 800b (scanning line drive circuit), and by a signal line 802 connected to a peripheral circuit part 800c (signal line drive circuit). A pixel part 800a has a thin film transistor 800d, which switches over a state in which the side of a signal line 802 and the side of a pixel electrode 804 are connected to the state in which they are broken, based on scan signals from a scanning line 801a. The thin film transistor 800d must have a small off current. A CMOS circuit of peripheral circuit parts 800b and 800c are composed of thin film transistors of different types of electric conductivity, and the CMOS circuit must have a high operating speed. Accordingly, it is possible to use a thin film transistor according to the present invention in a pixel part, and a self-aligned thin film transistor in peripheral circuit parts 800b and 800c.

The constitution will be explained below.

Figure 14:
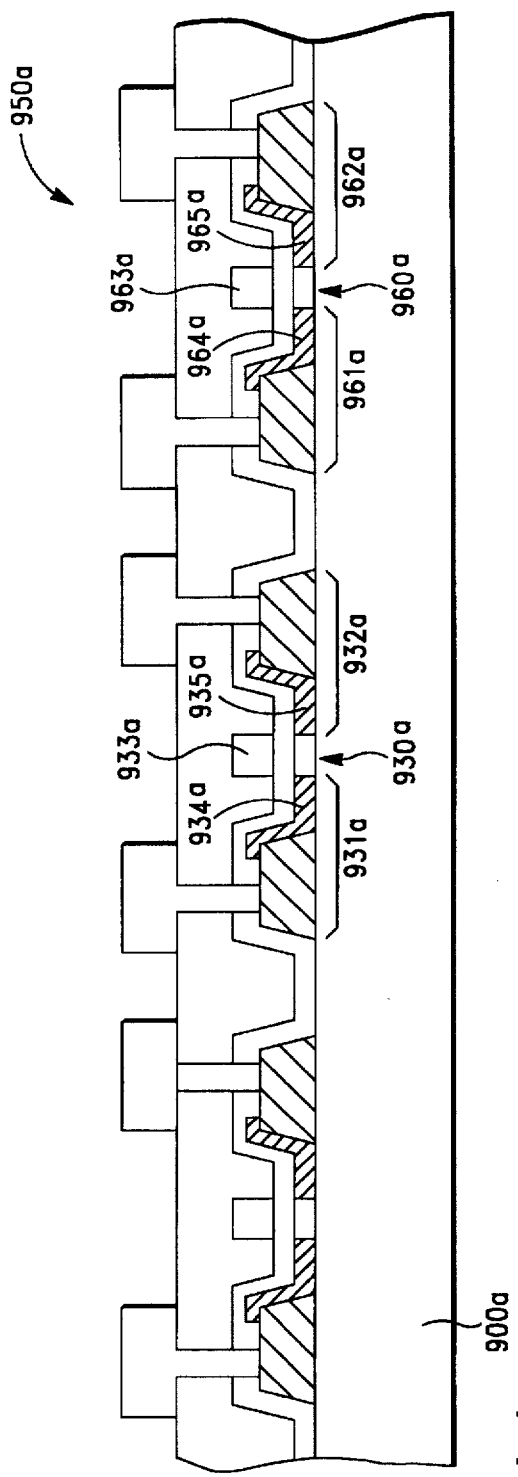
FIG. 14 is a sectional view of a thin film transistor formed on an active matrix substrate of a liquid crystal display panel according to the eighth embodiment of the present invention.

In FIG. 14, a thin film transistor formed in a pixel part of an active matrix substrate in this embodiment and three thin film transistors 900a, 930a and 960a formed in peripheral circuit parts are shown in a row.

In FIG. 14, shown on the right of the figure is an n-channel type thin film transistor 960a formed in a pixel part, shown in the middle of the figure is an n-channel type thin film transistor 930a formed in peripheral circuit parts, and shown on the left of the figure is a p-channel type thin film transitor 900a formed in peripheral circuit parts. In peripheral circuit parts, a CMOS circuit is composed of a p-channel type thin film transistor 900a and an n-channel type thin film transistor 930a.

Of these thin film transistors 900a, 930a and 960a, an n-channel type thin film transistor 960a used in a pixel part, as was explained in the first to seventh embodiments, a source area 961a and a drain area 962a are formed in a non-self-aligned way to a gate electrode 963a, and the transistor 960a confronts an end of a gate electrode 963a with the n$^-$ source area 964a (low concentration source area) and an n$^-$ drain area 965a (low concentration drain area). P-channel type thin film transistors 900a and 930a formed in peripheral circuit parts, on the other hand, have a self-aligned structure. Note that in a liquid crystal display panel, a pixel electrode is connected electrically-conductively to a drain area 962a of an n-channel type thin film transistor 960a in a pixel part, but that in the following explanation, it is illustrated as a structure in which a usual aluminum electrode is connected electrically-conductively to a drain area, as in a source area 961a.

In an active matrix substrate 950a of such a structure, an n-channel type thin film transistor 960a has an LDD structure in a pixel part, and has a structure in which density of a trap energy level is reduced, therefore its off current is decreased. An n-channel type thin film transistor 900a and a p-channel type thin film transistor 930a formed in peripheral circuit parts, on the other hand, have a self-aligned structure with small parasitic capacitance. Therefore, the operating speed in peripheral circuit parts is never sacrificed.

Ninth Embodiment

A constitution of an active matrix substrate with peripheral circuits of a liquid crystal display panel built-in according to the ninth embodiment will be explained below.

An active matrix substrate with peripheral circuits built-in in this embodiment and an active matrix base with peripheral circuits built-in according to the eighth embodiment have the same basic structure, but they differ in the combination of thin film transistors used in a pixel area and peripheral circuit parts (drive circuit parts). In this embodiment, the production cost can be lowered by improving off current characteristics of a thin film transistor used in a pixel part 800a, and by decreasing the number of masks used in a manufacturing process of an active matrix substrate 800 without sacrificing the operating speed in peripheral circuit parts 800b and 800c.

The structure of the thin film transistor will be explained below.

Figure 15:
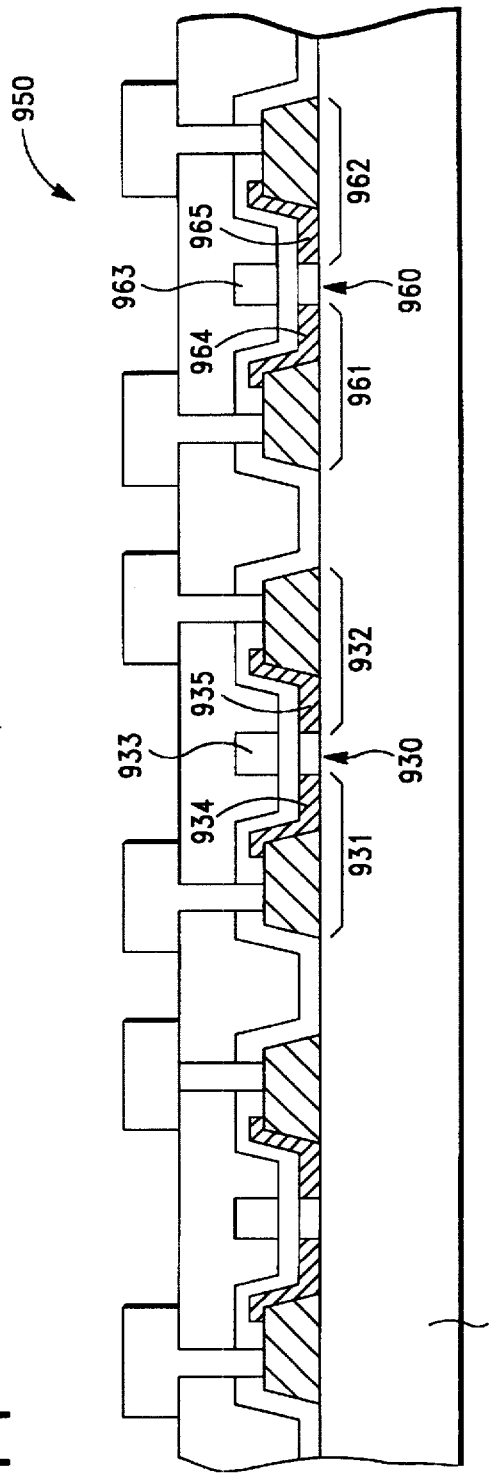
FIG. 15 is a sectional view of a thin film transistor formed on an active matrix substrate of a liquid crystal display panel according to the ninth embodiment of the present invention.

FIG. 15 is a sectional view showing a constitution of a thin film transistor formed in a pixel part of an active matrix substrate and a thin film transistor formed in peripheral circuit parts in a liquid crystal display panel illustrated in FIGS. 12 and 13.

In FIG. 15, shown on the right of the figure is an n-channel type thin film transistor 960 formed in a pixel part, shown in the middle of the figure is an n-channel type thin film transistor 930 formed in peripheral circuit parts, and shown on the left of the figure is a p-channel type thin film transitor 900 formed in peripheral circuit parts. In peripheral circuit parts, a CMOS circuit is composed of a p-channel type thin film transistor 900 and an n-channel type thin film transistor 930.

Of these thin film transistors 900, 930 and 960, in an n-channel type thin film transistor 960 used in a pixel part and an n-channel type thin film transistor 930 formed in peripheral circuit parts, as was explained in the first to seventh embodiments, source areas 931 and 961 and drain areas 932 and 962 are formed in a non-self-aligned way to gate electrodes 933 and 963, and the transistors 960 and 930 confront ends of gate electrodes 933 and 963 with the n$^-$ source areas 934 and 964 (low concentration source areas) and n$^-$ drain areas 935 and 965 (low concentration drain areas), respectively.

A p-channel type thin film transistor 900 formed in peripheral circuit parts, on the other hand, has a self-aligned structure. Note that in a liquid crystal display panel, a pixel electrode is connected electrically-conductively to a drain area 962 of an n-channel type thin film transistor 960 in a pixel part, but that in the following explanation, it is illustrated as a structure in which a usual aluminum electrode is connected electrically-conductively to the drain area, as in a source area 961.

In an active matrix substrate 950 of such a structure, an n-channel type thin film transistor 960 has an L00 structure in a pixel part, and has a structure in which density of a trap energy level is reduced, therefore its off current is decreased. An n-channel type thin film transistor 930 formed in peripheral circuit parts, on the other hand, is not self-aligned, therefore it has larger parasitic capacitance than a self-aligned structure, and there is a fear of its operating speed being low. However, either an n-channel type thin film transistor or a p-channel type thin film transistor has a self-aligned structure with small parasitic capacitance (in this embodiment, a p-channel type thin film transistor is self-aligned). Furthermore, even in a non-self-aligned thin film transistor, since source and drain areas overlapping a gate electrode are low concentration areas, the parasitic capacitance can be almost ignored when it is biased in the direction in which a depletion layer extends.

Taking that into consideration, if a CMOS circuit is formed to have such a structure as in this embodiment, the operating speed is not lower than that in the case in which both an n-channel type thin film transistor and a p-channel type thin film transistor have a self-aligned structure. Accordingly, in this embodiment, since two types of thin film transistors are formed on an active matrix substrate 950, productivity can be raised by decreasing the number of masks used in a manufacturing process of an active matrix substrate, compared to an active matrix substrate 950a according to the eighth embodiment in which three types of thin film transistors are employed.

Tenth Embodiment

FIGS. 16 (a) to (d) are process sectional views showing a part of a manufacturing method of each thin film transistor in a pixel part and peripheral circuit parts when two types of thin film transistors are formed on an active matrix substrate of a liquid crystal display panel, as in the ninth embodiment.

Figure 16A:
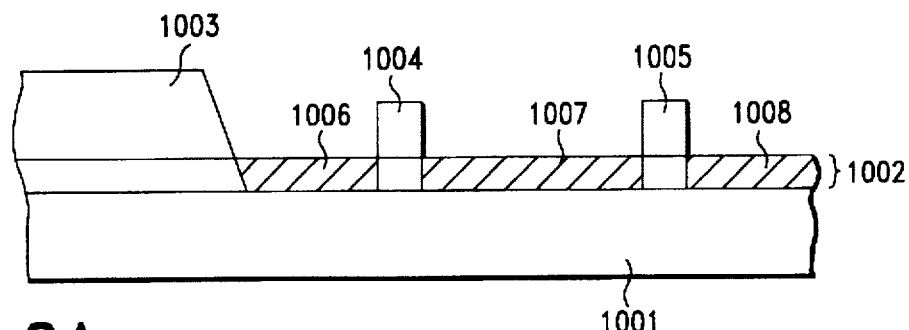
FIGS. 16(a) to (d) are process sectional views showing a part of a manufacturing method of a thin film transistor formed on an active matrix substrate of a liquid crystal display panel according to the tenth embodiment of the present invention.

First, as is shown in FIG. 16(a), on the surface of an insulation substrate 1001 made from glass, quartz, sapphire and so on, about 500Å of an amorphous silicon film 1002, for instance, is built up. Resist patterns 1003, 1004 and 1005 are formed on 1002. With these patterns used as masks, phosphorus is ion implanted to form low concentration areas 1006, 1007 and 1008 containing about $1 \times 10^{17}$ cm$^{-3}$ of impurities.

Second, an amorphous silicon film 1002 is annealed by the irradiation of a laser beam to polycrystallize the film and activate the impurities injected to it simultaneously.

Figure 16B:
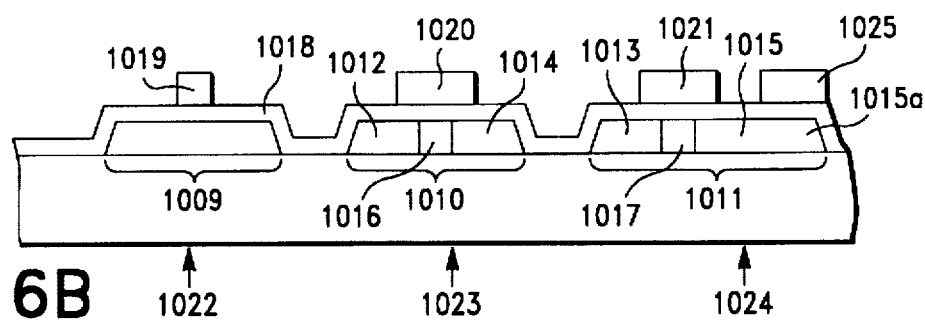

Third, as is shown in FIG. 16(b), an amorphous silicon film 1002 is etched selectively to form silicon thin film patterns 1009, 1010 and 1011. Silicon thin film patterns 1009 and 1010 become active areas of a p-channel type thin film transistor and an n-channel type thin film transistor in peripheral circuit parts, respectively, while a silicon thin film pattern 1011 becomes an active area of an n-channel type thin film transistor in a pixel part. And the above-mentioned low concentration areas 1006, 1007 and 1008 become n$^-$ source areas 1012 and 1013 (low concentration source areas) and n$^-$ drain areas 1014 and 1015 (low concentration drain areas) of an n-channel type thin film transistor. The area in an active areas 1010 and 1011 of an n-channel type thin film transistor to which impurities are not implanted becomes channel areas 1016 and 1017.

Fourth, after a gate insulation film 1018 consisting of a silicon oxidation film is formed on the whole surface in an ECR-CVO method, respective gate electrodes 1019, 1020 and 1021 made from such materials as metal are formed on the surface. Of respective gate electrodes 1019, 1020 and 1021, ends of gate electrodes 1020 and 1021 to form n-channel type thin film transistors 1023 and 1024 confront n$^-$ source areas 1012 and 1013 and n$^-$ drain areas 1014 and 1015 through a gate insulation film 1018. In an extended part 1015a (lower electrode) in a drain area 1015 of a thin film transistor 1024 used in a pixel part, a storage capacitance is composed of an overlapping gate electrode 1025 in an upper state.

Figure 16C:
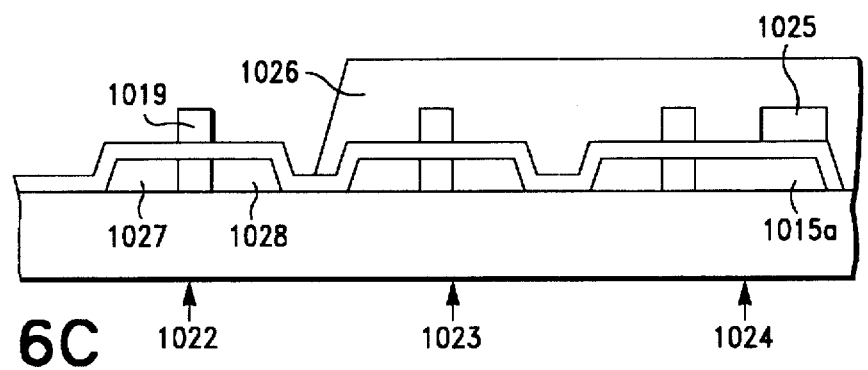

Fifth, as is shown in FIG. 16(c), employing such a technique as a photolithography technique, a resist pattern 1026 to cover a forming-area of n-channel type thin film transistors 1023 and 1024 is formed, and boron is ion implanted. In this ion implantation, a gate electrode 1019 is used as a mask, and a source area 1027 and a drain area 1028 of the impurity concentration of about $5 \times 10^{21}$ cm$^{-3}$ are formed self-alignedly in a thin film transistor 1022.

Sixth, after a resist pattern 1026 is removed, impurities are activated by irradiating a laser beam. The irradiation of a laser beam is performed to activate impurities to lower their resistance, not to restore the crystalline state disturbed by the implanted impurities. A p-channel type thin film transistor 1022 used in peripheral circuit parts need not have a small off current. Accordingly, in this process, it is sufficient to lower the resistance of the impurities by activating them by the irradiation of a laser beam. The restoration of the crystalline state is not required.

Figure 16D:
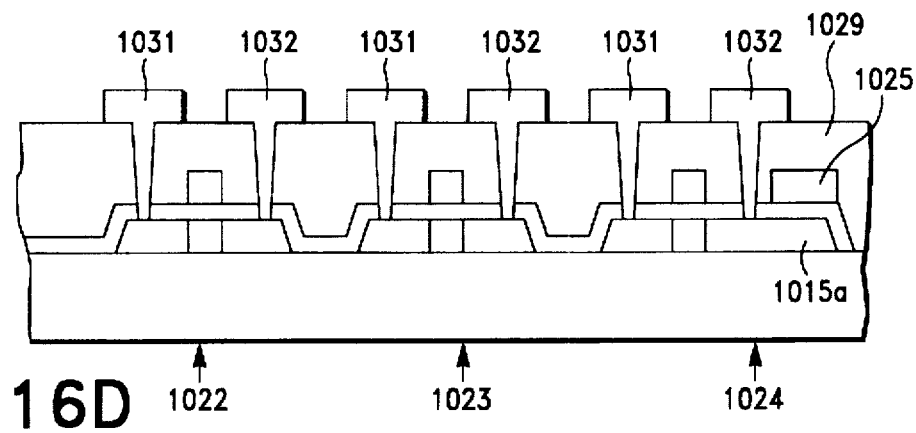

Seventh, as is shown in FIG. 16(d), an interlayer insulation film 1029 is formed. Making use of contact holes in 1029, a source electrode 1031 and a drain electrode 1032 are connected electrically-conductively to respective thin film transistors 1022, 1023 and 1024.

As is clear from the above explanation, in a manufacturing method of an active matrix substrate in this embodiment, as mask patterns used in the implantation of impurities, two mask patterns 1003 and 1026 can be employed. By contrast, if both an n-channel type thin film transistor and a p-channel type thin film transistor to form peripheral circuit parts have a self-aligned structure, and a thin film transistor used in a pixel part has a structure according to the present invention, three masks will be necessary. The operating speed of a circuit, as was explained in the ninth embodiment, is almost the same in the eighth and ninth embodiments. Hence, the production cost can be reduced by decreasing the number of masks without sacrificing the operating speed and so on.

Note that in this embodiment, a thin film transistor used in a pixel part is an n-channel type, but that it remains in the domain of the present invention if it is a p-channel type.

Figure 17A:
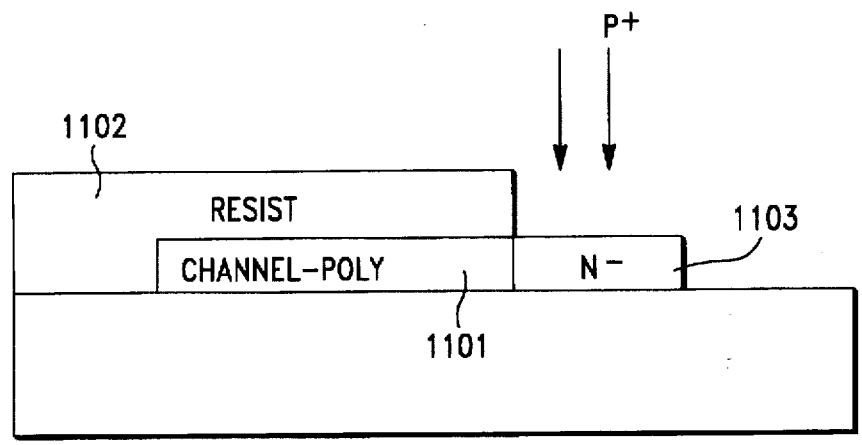
FIGS. 17(a) and (b) are process sectional views showing a part of a method of manufacturing a storage capacitor in a pixel part in a conventional liquid crystal display panel.
Figure 17B:
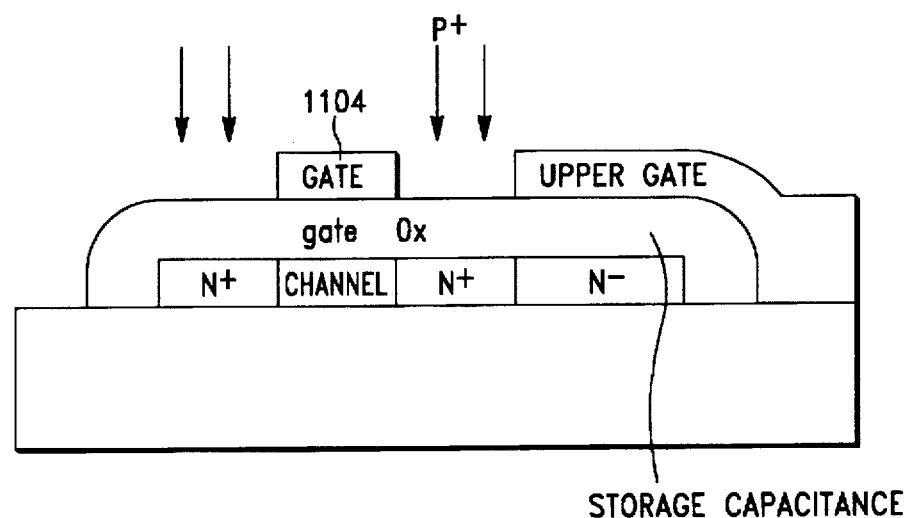

In a liquid crystal display panel, as is shown in FIG. 13, to form a storage capacitance 805 in a pixel part, there is a tendency that a structure in which an extended part is established on the side of a drain area, and scanning lines in an upper state overlap the extended part is adopted. In order to form a storage capacitance having this structure, in a conventional manufacturing method as a comparative example, as is shown in FIGS. 17(a) and (b), after a resist mask 1102, which was made by opening a hole at an end of a polycrystalline silicon film 1101, is formed, ions are implanted to make an extended part 1103 a low concentration area, and then with a gate electrode 1104 used as a mask, impurities of high concentration are ion implanted. According to a manufacturing method in this embodiment, as is shown in FIGS. 16(a) and (b), in a process in which impurities of low concentration are implanted, an extended part 1015a becomes a low concentration area automatically. In subsequent processes, as is shown in FIG. 16(b), when gate electrodes 1019, 1020 and 1021 are formed, a scanning line 1025 in an upper state formed simultaneously with the electrodes should be made to overlap an extended part 1015a. Accordingly, it is possible to make a storage capacitance making use of a process to manufacture a thin film transistor 1024 in a pixel part without adding other processes.

Eleventh Embodiment

FIGS. 18(a) to (e) are process sectional views showing a part of a manufacturing method of a matrix substrate with peripheral circuits of a liquid crystal display panel built-in, in which a CMOS circuit in a drive part is composed of an n-channel type thin film transistor having a non-self-aligned structure and a p-channel type thin film transistor having a self-aligned structure with small parasitic capacitance which can operate at a high speed, and in which an n-channel type thin film transistor in a pixel part has a non-self-aligned structure.

In the figures, n-channel type thin film transistors 1300a and 1300c have a source area and a drain area consisting of silicon films of different thickness. Gate electrodes 1317 and 1318 overlap a part of n⁻ source areas 1310 and 1311 and n⁻ drain areas 1312 and 1313, which are thin and of under $1 \times 10^{19}$ cm⁻³ of impurity concentration through a gate insulation film 1316. In a p-channel type thin film transistor 300b, on the other hand, a p⁻ source area 1323 and a p-drain area 1324 are formed to be self-aligned to a gate electrode 1319.

The area consisting of thick silicon films in a source area and a drain area of an n-channel type thin film transistors 1300a and 1300c is n⁻ source areas 1302 and 1303 and n⁻ drain areas 1304 and 1305 of high impurity concentration, therefore the lowering of an on current on account of parasitic resistance is prevented.

In order to manufacture a matrix substrate of such a structure, first, as is shown in FIG. 13(a), on an insulation substrate 1301 made from glass, quartz, sapphire and so on, n⁻ source areas 1302 and 1303 and n⁻ drain areas 1304 and 1305, consisting of n⁻ silicon thin films such as polycrystalline silicon with the thickness of about 2000Å to which about $5 \times 10^{21}$ cm⁻³ of phosphorus is added, are formed. Silicon patterns 1306 and 1307 of the thickness of about 500Å are formed on the surface to connect 1302 and 1304, 1303 and 1305, respectively. At the same time, a silicon pattern 1308 to form a p-channel type thin film transistor 300b is formed.

Figure 18A:
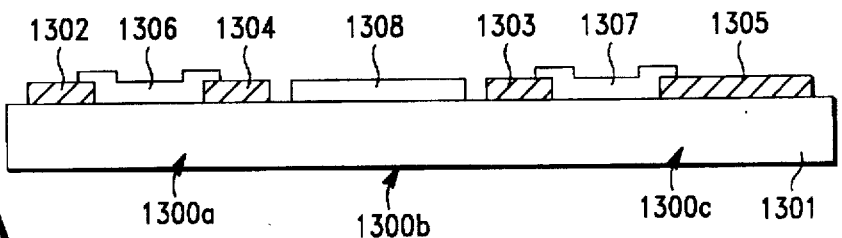
FIGS. 18(a) to (e) are process sectional views showing a part of a manufacturing method of a thin film transistor formed on an active matrix substrate of a liquid crystal display panel according to the eleventh embodiment of the present invention.
Figure 18B:
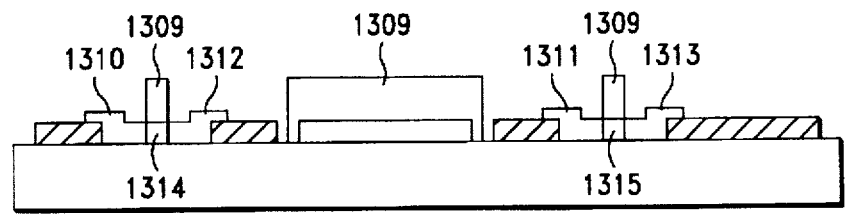

Then, as is shown in FIG. 18(b), a resist pattern 1309 is formed employing a photolithography technique, and with 1309 used as a mask, an ion injection is performed to make a part of silicon thin film patterns 1306 and 1307 of about $5 \times 10^{18}$ cm⁻³ of concentration. The area becomes n⁻ source areas 1310 and 1311 and drain areas 1312 and 1313 of a thin film transistor of so-called GOLOO type (gate overlap LDD type). The area in silicon patterns 1306 and 1307 to which ions were not implanted becomes channel areas 1314 and 1315.

After a resist pattern 1309 is stripped, by the irradiation of a laser beam on the whole surface, implanted impurities are activated and crystalline grains in channel areas 1314 and 1315 are enlarged at the same time to improve the characteristics of a transistor.

Figure 18C:
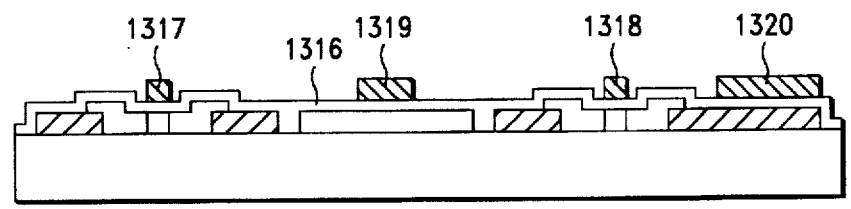

Then, as is shown in FIG. 18(c), a gate oxidation film 1316 consisting of an insulation film such as a silicon oxidation film is formed on the whole surface, on the surface of which gate electrodes 1317, 1318 and 1319, made from metal, a transparent electrically-conductive film, polycrystalline silicon film to which impurities are added and so on, are formed. Gate electrodes 1317 and 1318 overlap a part of n⁻ source areas 1310 and 1311 and drain areas 1312 and 1313 through a gate insulation film 1316. And a part of an n+ drain area 1305 of a thin film transistor used in a pixel part overlaps a gate electrode 1320 in an upper state through a gate insulation film 1316 to form a storage capacitance.

Figure 18D:
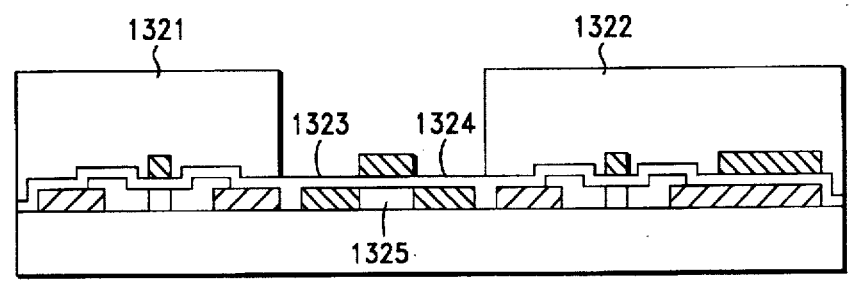

Next, as is shown in FIG. 18(d), employing a photolithography technique, resist patterns 1321 and 1322 to cover an n-channel type thin film transistor 1300a and an n-channel type thin film transistor 1300c in a pixel part are formed. With the resist patterns used as masks, boron is ion implanted to form a p⁻ source area 1323 and a p⁻ drain area 1324 of about $5 \times 10^{21}$ cm⁻³. The area to which ions were not implanted becomes a channel-forming area 1325.

Figure 18E:
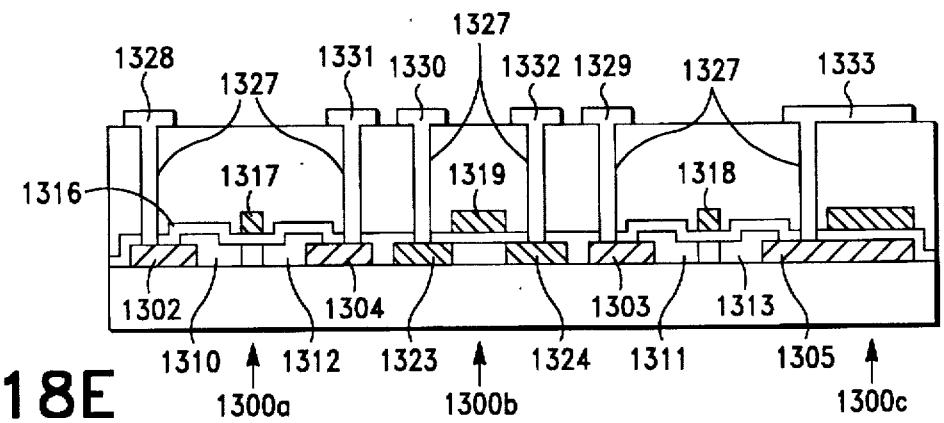
Figure 20:
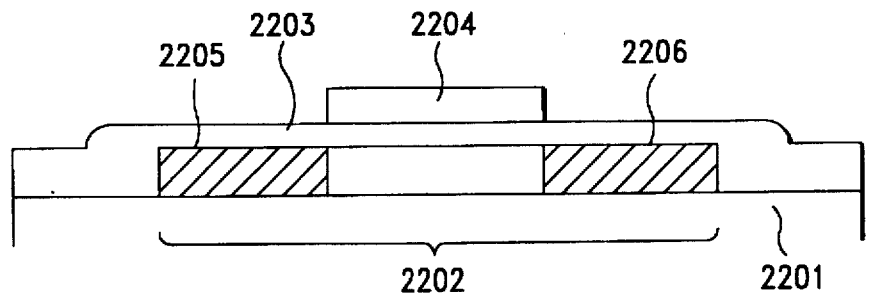
FIG. 20 is a sectional view showing a constitution of a transistor.
Figure 21:
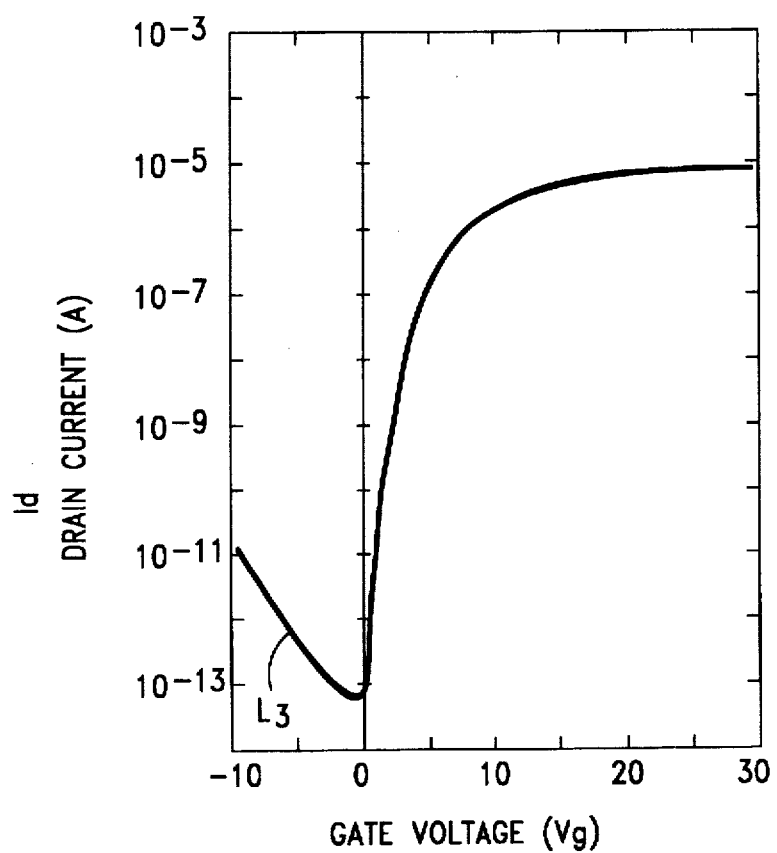
FIG. 21 is a graph showing off current characteristics of a conventional thin film transistor; and, FIGS. 22(a) to (d) are sectional views showing a manufacturing method of another conventional thin film transistor.
Figure 22A:
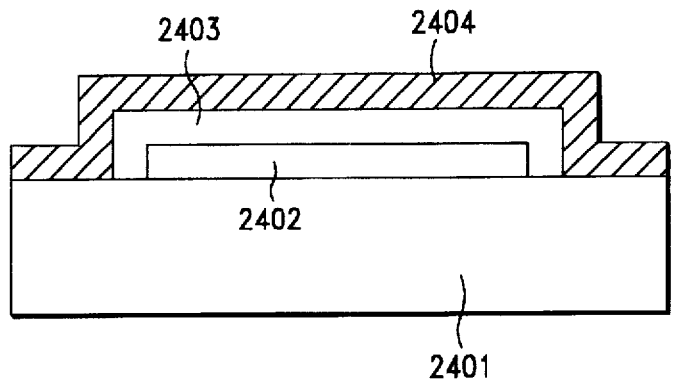
Figure 22B:
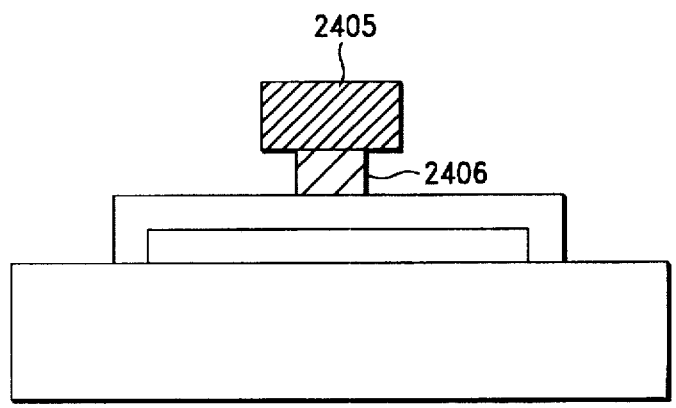
Figure 22C:
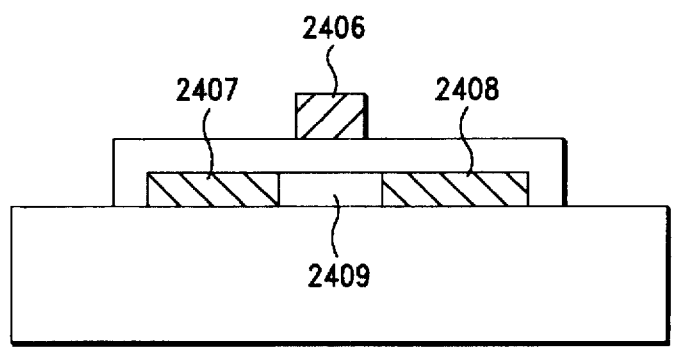
Figure 22D:
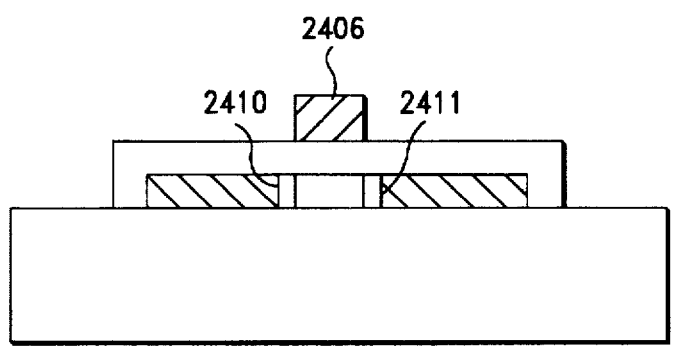

After resist patterns 1321 and 1322 are removed, impurities are activated by the irradiation of a laser beam. After that, as in a usual process, as is shown in FIG. 18(e), after an interlayer insulation film 1326 consisting of a silicon oxidation film is formed, contact holes 1327 are made in it. Through these contact holes 1327, source electrodes 1328, 1329 and 1330 are connected to an n+ source area 1302, an n⁻ source area 1303 and a p⁻ source area, while drain electrodes 1331 and 1332 are connected to an n⁻ drain area 1304 and a p+ drain area 1324. And a pixel electrode 1333 is connected to an n+drain area 1305 of a thin film transistor in a pixel part.

As was explained above, in this embodiment, since an n⁻ source area 1311 and an n⁻ drain area 1313 are activated before gate electrodes 1317 and 1318 are formed, the material of a gate electrode 1318 can be selected without being restricted by the activation condition. Therefore a gate electrode 1318 can be made from metal.

In setting up an n-channel type thin film transistor 1300c with a small off current in a pixel part, it has the same structure as that of an n-channel type thin film transistor 1300a in peripheral circuit parts, therefore its manufacturing process can be simplified.

In this case, too, since a p-channel type thin film transistor 1300b to form a CMOS circuit in peripheral circuit parts has a self-aligned structure, the operating speed is not sacrificed. And since there is no need to consider off current characteristics, a p-channel type thin film transistor 1300b can be composed of a source area and a drain area of high concentration consisting of one silicon pattern to minimize the increase of the number of processes.

Twelfth Embodiment

In this embodiment, an n-channel type thin film transistor is used in a pixel part of a liquid crystal display with peripheral circuits built-in, and a CMOS circuit is composed of a self-aligned thin film transistor with small parasitic capacitance which can operate at a high speed. This embodiment is a variation of the eighth embodiment in which three types of thin film transistors are employed.

FIGS. 19(a) to (e) are process sectional views.

As is shown in FIG. 19(e), in an active matrix substrate in this embodiment, on a common insulation substrate 1401, in a pixel part, there is an n-channel type thin film transistor 1400a having a so-called GOLDO structure, while in peripheral circuit parts, there is a CMOS circuit composed of an n-channel type thin ftilm transistor 1400b and a p-channel type thin film transistor 1400c having a self-aligned structure.

In order to manufacture these thin film transistors, first, as is shown in FIG. 19(a), about 1000Å, for instance, of a polycrystalline silicon thin film, is built up on the surface of an insulation substrate 1401 made from such materials as glass, and silicon thin film patterns 1402, 1403, 1404, 1405, 1406 and 1407 are formed by selectively etching the silicon thin film. Then, phosphorus is ion implanted to the whole surface to make the silicon thin film patterns 1402, 1403, 1404, 1405, 1406 and 1407 of about $5 \times 10^{18}$ cm$^{-3}$ of concentration.

Then channel areas 1408, 1409 and 1410 consisting of a silicon thin film such as about 1000Å of polycrystalline silicon film are formed in such a way as to connect silicon thin film patterns 1402 and 1403, patterns 1404 and 1405, and patterns 1406 and 1407, respectively.

As is shown in FIG. 19(b), the whole surface is thermal oxidated to form gate insulation films 1411, 1412 and 1413 consisting of a silicon oxidation film. This thermal treatment process also has an effect of activating implanted ions. Next, gate electrodes 1414, 1415 and 1416 consisting of metal, a transparent electrically-conductive film, a polycrystalline silicon film to which impurities are added and so on, are formed in the fixed area on the surface of gate insulation films 1411, 1412 and 1413. A gate electrode 1414 overlaps a part of n$^-$ silicon thin film patterns 1402 and 1403 through a gate insulation film 1411. Gate electrodes 1415 and 1416, on the other hand, do not overlap n$^-$ silicon thin film patterns 1404 and 1405, respectively.

As is shown in FIG. 19(c), employing a photolithography technique, resist patterns 1417 and 1418 are formed in such a way as to cover at least ends of gate electrodes of a p-channel type thin film transistor and an n-channel type thin film transistor in a pixel part. With the resist patterns used as masks, phosphorus is ion implanted to form n+ source areas 1419 and 1420 and n+ drain areas 1421 and 1422.

After resist patterns 1417 and 1418 are removed, as is shown in FIG. 19(d), employing a photolithography technique and others, resist patterns 1423 and 1424 are formed in an area to cover an n-channel type transistor and an n-channel type transistor in a pixel part. With these patterns used as masks, boron is ion implanted to form a p$^-$ source area 1425 and a p$^-$ drain area 1426 of about $5 \times 10^{21}$ cm$^{-3}$.

After resist patterns 1417 and 1418 are removed, as is shown in FIG. 19(e), impurities are activated by the irradiation of a laser beam. After that, as in a usual process, source electrodes 1427, 1428 and 1429 and drain electrodes 1430, 1431 and 1432 consisting of metal, a transparent electrically-conductive film and so on, are connected to n$^-$ source areas 1419 and 1420, a p$^-$ source area 1425, n$^-$ drain areas 1421 and 1422, and a p$^-$ drain area 1426, respectively. An n-channel type thin film transistor 1400a having a so-called GOLDO structure is formed in a pixel part, while n-channel type and p-channel type thin film transistors 1400b and 1400c having a self-aligned structure are formed in peripheral circuit parts.

Industrial Applicability

As is clear from the above explanation, according to the present invention, the area to overlap ends of a gate electrode in a source area and a drain area through a gate insulation film is a low concentration area formed in a process prior to that in which a gate electrode is formed. Therefore, according to the present invention, when impurities implanted to a source area and a drain area are activated, a gate electrode is not yet formed. Accordingly, since impurities can be activated without being restricted by the heat resistance of components of a gate electrode, and the disturbance of the crystalline state caused by the implantation of impurities can be restored sufficiently, density of a trap energy level in a drain area and its neighborhood can be reduced. And since a drain area overlaps a gate electrode in a low concentration area, field strength in that area is small. Hence, the improvement of off current characteristics of a thin film transistor is obtained.

If a low concentration area is where the crystallization of a silicon film is performed after the implantation of impurities to a silicon film, in addition to the raise of productivity owing to the decrease of the number of processes, there is an advantage of the further improvement of off current characteristics because the crystalline state is not disturbed by the implantation of impurities after the crystallization treatment.

When the thickness of films in a low concentration area is equal to that of films in a channel area, the surface is flattened and an electric field does not concentrate locally, hence the improvement of off current characteristics. If films in a low concentration area are thinner than a depletion layer determined by the impurity concentration, the depletion layer reaches the lower face of the low concentration area, and the capacitance connected in series increases, therefore the parasitic capacitance decreases.

If an area with a thick film which connects to a low concentration area, or a high concentration area is set up in a source area and a drain area, since the areas reduce the parasitic resistance, the operating speed is not sacrificed.

In a liquid crystal display panel with said thin film transistor (n-channel type thin film transistor) built-in in a pixel part, if the same n-channel type thin film transistor is employed in a CMOS circuit in a drive circuit part and if a p-channel type thin film transistor to constitute a CMOS circuit with an n-channel type thin film transistor has a self-aligned structure, processes can be simplified and a high speed operation of a drive circuit can be realized making full use of each process. Because a thin film transistor having a self-aligned structure is in a drive circuit part, off current characteristics are not imposed strict conditions. So the increase of the number of processes can be minimized by forming the transistor as an integral high concentration area.

Furthermore, if an extended area which is formed at the same time with a low concentration area and so on, and which is to form a storage capacitance between it and a gate line in an upper state, is formed in a drain area of a liquid crystal display panel, a storage capacitance can be composed making use of other processes.

I claim:

1. A thin film transistor on a substrate, comprising:

a thin silicon film on the substrate, said thin silicon film including a source area, a drain area and a channel area connecting between the source and drain areas, said source and drain areas containing impurities of a predetermined type;

a gate insulation film on the channel area and at least a portion of the source and drain areas; and a gate electrode on the gate insulation film over the channel area, the gate electrode having a first end substantially overlapping one end of the source area and a second end substantially overlapping one end of the drain area for reducing an electric field strength near said ends of said gate electrode;

wherein the ends of the source area and the drain area overlapped by the gate electrode are low impurity concentration areas;

wherein the impurity concentration of the low impurity concentration areas is not greater than $1 \times 10^{20}$ cm$^{-3}$;

wherein the thickness of the low impurity concentration areas is not greater than 500Å; and wherein the low impurity concentration areas of the source and drain areas are formed in a process prior to formation of the gate electrode.

2. The transistor of claim 1, wherein the thickness of the source and drain areas is thinner than the thickness of a depletion layer created by a predetermined potential applied to the gate electrode.

3. The transistor of claim 1, wherein a the thickness of the source, drain and channel areas are approximately the same.

4. The transistor of claim 1, wherein each of the source and drain areas has a high impurity concentration area for connecting to a respective electrode and a low impurity concentration area having one end overlapped by the gate electrode.

5. A thin film transistor on a substrate, comprising:

first and second silicon patterns containing impurities of a predetermined type on the substrate as a source area and a drain area of the transistor;

a thin silicon film on the substrate connecting between the source and drain areas as a channel area of the transistor;

a gate insulation film on said channel area and at least a portion of the source and drain areas; and a gate electrode on the gate insulation film over the channel area, the gate electrode having a first end substantially overlapping one end of the source area and a second end substantially overlapping one end of the drain area for reducing an electric field strength near said ends of said gate electrode wherein the ends of the source area and the drain area overlapped by the gate electrode are low impurity concentration areas;

wherein the impurity concentration of the low impurity concentration areas is not greater than $1 \times 10^{20}$ cm$^{-3}$;

wherein the thickness of the low impurity concentration areas is not greater than 500Å; and wherein the low impurity concentration areas of the source and drain areas are formed in a process prior to formation of the gate electrode.

6. The transistor of claim 5, wherein each of the source and drain areas includes a high impurity concentration portion for connecting to a respective electrode and a low impurity concentration area having one end overlapped by the gater electrode.

7. A thin film transistor on a substrate, comprising:

first and second silicon patterns on the substrate, each pattern containing a high concentration of impurities of a predetermined type;

a thin silicon film containing a low concentration of impurities on the substrate connecting between the first and second silicon patterns, the thin silicon film including first, second and third portions with the third portion as a channel area of the transistor connecting between the first and second portions, the first portion and the first silicon pattern forming a source area of the transistor, the second portion and the second silicon pattern forming a drain area of the transistor;

a gate insulation film on the channel area and at least a portion of the source and drain areas; and a gate electrode on the gate insulation film over the channel area, the gate electrode having a first end substantially overlapping one end of the source area and a second end substantially overlapping one end of the drain area for reducing an electric field strength near said ends of said gate electrode;

wherein the ends of the source area and the drain area overlapped by the gate electrode are low impurity concentration areas;

wherein the impurity concentration of the low impurity concentration areas is not greater than $1 \times 10^{20}$ cm$^{-3}$;

wherein the thickness of the low impurity concentration areas is not greater than 500Å and wherein the low impurity concentration areas of the source and drain areas are formed in a process prior to formation of the gate electrode.

8. A CMOS circuit on a substrate, comprising:

first, second, third and fourth silicon patterns on the substrate as source and drain areas of a first thin film transistor and source and drain areas of a second thin film transistor, respectively, each of the first and second patterns including a first portion containing a high concentration of impurities of a first conductivity type for connecting to a respective electrode and a second portion containing a low concentration of impurities of the first conductivity type, each of the third and fourth patterns including a first portion containing a high concentration of impurities of a second conductivity type opposite to the first conductivity type and a second portion containing a low concentration of impurities of the second conductivity type;

first and second thin silicon films connecting between the first and second patterns and the third and fourth patterns, respectively, as channel areas of the respective transistors;

a gate insulation film on the source, drain and channel areas of the two transistors; and two gate electrodes on the gate insulation film over the respective channel areas, each gate electrode having a first end substantially overlapping one end of a respective second portion of a respective source area and a second end substantially overlapping one end of a respective second portion of a respective drain area for reducing an electric field strength near said ends of said gate electrodes;

wherein the ends of the source areas and the drain areas overlapped by the gate electrodes are low impurity concentration areas;

wherein the impurity concentration of the low impurity concentration areas is not greater than $1 \times 10^{20}$ cm$^{-3}$;

wherein the thickness of the low impurity concentration areas is not greater than 500Å; and wherein the low impurity concentration areas of the source and drain areas are formed in a process prior to formation of the gate electrodes.

9. An LCD circuit having a pixel part and a peripheral circuit coupled to the pixel part, comprising:

first, second, third, fourth, fifth and sixth silicon patterns on the substrate as source and drain areas of a first thin film transistor, source and drain areas of a second thin film transistor, and source and drain areas of a third thin film transistor, respectively, each of the first, second, third and fourth patterns including a first portion containing a high concentration of impurities of a first conductivity type for connecting to a respective electrode and a second portion containing a low concentration of impurities of the first conductivity type, each of the fifth and sixth patterns including a first portion containing a high concentration of impurities of a second conductivity type opposite to the first conductivity type and a second portion containing a low concentration of impurities of the second conductivity type;

first, second and third thin silicon films connecting between the first and second patterns, the third and fourth patterns and fifth and sixth patterns, respectively, as channel areas of the respective transistors;

a gate insulation film on the source, drain and channel areas of the three transistors; and first, second and third gate electrodes on the gate insulation film over the channel areas of the first, second and third transistors, respectively, the second gate electrode having a first end substantially overlapping one end of the second portion of the source area of the second transistor and a second end substantially overlapping one end of the second portion of the drain area of the second transistor for reducing an electric field strength near said ends of said second gate electrode;

wherein the first and third transistors constitute a CMOS circuit in the peripheral circuit and the second transistor constitutes a part of the pixel area;

wherein the ends of the source area and the drain area overlapped by the gate electrode are low impurity concentration areas;

wherein the impurity concentration of the low impurity concentration areas is not greater than $1 \times 10^{20}$ cm$^{-3}$;

wherein the thickness of the low impurity concentration areas is not greater than 500Å; and wherein the low impurity concentration areas of the source and drain, areas are formed in a process prior to formation of the gate electrodes.

10. The LCD circuit of claim 9, wherein the source and drain areas of the first and third transistors are self-aligned relative to the respective gate electrodes.

11. The LCD circuit of claim 9, wherein the first gate electrode has a first end overlapping one end of the second portion of the source area of the first transistor and a second end overlapping one end of the second portion of the drain area of the first transistor.

12. The LCD circuit of claim 11, wherein the source and drain areas of the third transistor are self-aligned relative to the third gate electrode.

13. The LCD circuit of claim 9, wherein the second transistor has a GOLDD structure.

14. The LCD circuit of claim 13, wherein the source and drain areas of the first and third transistors are self-aligned relative to the respective gate electrodes.

15. An LCD circuit having a pixel part and a peripheral circuit coupled to the pixel part, comprising:

first, second and third silicon patterns on the substrate, each of the three patterns including first, second and third portion as source, drain and channel areas of first, second and third thin film transistors, respectively, the source and drain areas of the first and second transistors containing impurities of a first conductivity type, the drain area of the second transistor including an extended part, the source and drain areas of the third transistor containing impurities of a second conductivity type opposite to the first conductivity type;

a gate insulation film on the source, drain and channel areas of the three transistors;

first, second and third gate electrodes on the gate insulation film over the channel areas of the first, second and third transistors, respectively, the first and second gate electrodes each having a first end substantially overlapping one end of the respective source area and a second end substantially overlapping one end of the respective drain area for reducing an electric field strength near said ends of said first and second gate electrodes; and a fourth gate electrode on the gate insulation film over the extended part of the drain area of the second transistor, the fourth gate electrode forming a storage capacitance with the extended part;

wherein the first and third transistors constitute a CMOS circuit in the peripheral circuit and the second transistor constitutes a part of the pixel part;

wherein the ends of the source areas and the drain areas overlapped by the gate electrodes are low impurity concentration areas;

wherein the impurity concentration of the low impurity concentration areas is not greater than $1 \times 10^{20}$ cm$^{-3}$;

wherein the thickness of the low impurity concentration areas is not greater than 500Å; and wherein the low impurity concentration areas of the source and drain areas are formed in a process prior to formation of the gate electrodes.

16. The LCD circuits of claim 15, wherein the source and drain areas of the third transistor are self-aligned relative to the third gate electrode.

17. The LCD circuit of claim 15, wherein the source and drain areas of the first and second transistors each include a low impurity concentration part adjacent to the associated channel area and a high impurity concentration part for connecting to a respective electrode and the extended part of the drain area of the second transistor is a high impurity concentration part; and, wherein the source and drain areas of the third transistor are high impurity concentration areas.

18. The LCD circuit of claim 17, wherein the source and drain areas of the third transistor are self-aligned relative to the third gate electrode.

* * * * *

UNITED STATES PATENT AND TRADEMARK OFFICE
CERTIFICATE OF CORRECTION

PATENT NO.       :   5,757,048
DATED            :   May 26, 1998
INVENTOR(S)      :   Satoshi Inoue It is certified that errors appear in the above identified patent and that said Letters Patent is hereby corrected as shown below:

Title page, item 56, References Cited, change "61-104371" to --61-104671--.

Column 23, line 10, delete "a".

line 31, insert --;-- after electrode.

line 46, change "gater" to --gate--.

Column 24, line 9, insert --;-- after "500Å".

Column 25, line 31, delete "," after "drain".

Column 26, line 37, change "circuits" to --circuit--.

Signed and Sealed this

First Day of September, 1998

BRUCE LEHMAN

*Attest:*

*Attesting Officer*     Commissioner of Patents and Trademarks